United States Patent
Curtis et al.

(10) Patent No.: US 6,387,764 B1
(45) Date of Patent: May 14, 2002

(54) TRENCH ISOLATION PROCESS TO DEPOSIT A TRENCH FILL OXIDE PRIOR TO SIDEWALL LINER OXIDATION GROWTH

(75) Inventors: Todd O. Curtis; Vivek Rao, both of Austin, TX (US); Kerem Kapkin, Watsonville, CA (US)

(73) Assignee: Silicon Valley Group, Thermal Systems LLC, Scotts Valley, CA (US)

( * ) Notice: Subject to any disclaimer, the term of this patent is extended or adjusted under 35 U.S.C. 154(b) by 0 days.

(21) Appl. No.: 09/541,395

(22) Filed: Mar. 31, 2000

Related U.S. Application Data
(60) Provisional application No. 60/127,520, filed on Apr. 2, 1999.

(51) Int. Cl.$^7$ .................. H01L 21/336; H01L 21/76
(52) U.S. Cl. .................. 438/296; 438/404; 438/424
(58) Field of Search ................. 438/404, 424, 438/296

(56) References Cited

U.S. PATENT DOCUMENTS

| | | | |
|---|---|---|---|
| 5,741,740 A | * | 4/1998 | Jang et al. |
| 5,817,566 A | * | 10/1998 | Jang et al. |
| 5,933,748 A | | 8/1999 | Chou et al. ............ 438/431 |
| 5,960,299 A | | 9/1999 | Yew et al. ............ 438/424 |
| 6,008,095 A | | 12/1999 | Gardner et al. ............ 438/296 |
| 6,043,136 A | * | 3/2000 | Jang et al. |
| 6,057,208 A | | 5/2000 | Lin et al. ............ 438/424 |
| 6,100,163 A | * | 8/2000 | Jang et al. |
| 6,187,648 B1 | * | 2/2001 | Doi et al. |
| 6,197,658 B1 | * | 3/2001 | Jang |

* cited by examiner

Primary Examiner—John F. Niebling
Assistant Examiner—Josetta Jones
(74) Attorney, Agent, or Firm—Flehr Hohbach Test Albritton & Herbert LLP

(57) ABSTRACT

This invention relates generally to a method of trench isolation used in the fabrication of semiconductor devices, wafers and the like. More specifically, the present invention related to a method of trench isolation using chemical vapor deposition (CVD) with TEOS and ozone to deposit a trench fill oxide prior to growing a thermal oxide layer or liner on sidewalls of the trench. The method provides void-free as-deposited dielectric CVD films into gaps or trenches with non-vertical, vertical and or re-entrant profiles.

17 Claims, 27 Drawing Sheets

| UNDERLAYER | SiO$_2$ THICKNESS | EICH RATE As-dep | EICH RATE POST-ANNEAL | SHRINKAGE |
|---|---|---|---|---|
| BARE Si | 6718Å | 2038Å/MIN | 542Å/MIN | 4.78% |
| THERMAL OXIDE | 6380Å | 2036Å/MIN | 548Å/MIN | 5.07% |
| SILICON NITRIDE | 6380Å | 2046Å/MIN | 559Å/MIN | 5.07% |

° NO SURFACE SENSITIVITY AND 0.10um FILL

TRENCH ISOLATION PROCESS TO DEPOSIT A TRENCH FILL OXIDE PRIOR TO SIDEWALL LINER OXIDATION GROWTH

This appln claims benefit of Prov. No. 60/127,520 filed Apr. 2, 1999.

FIELD OF THE INVENTION

This invention relates generally to a method of trench isolation used in the fabrication of semiconductor devices, wafers and the like. More specifically, the present invention relates to a method of trench isolation using chemical vapor deposition (CVD) to deposit a trench fill oxide prior to sidewall liner oxidation growth.

BACKGROUND OF THE INVENTION

Chemical vapor deposition (CVD) methods are widely used in the semiconductor industry to deposit layers or films on the surface of semiconductor substrates. Providing void free gap fill capability of such films has been of extreme interest in the semiconductor industry since the introduction of CVD techniques in the later 1980's. The unique variable of selective deposition rates dependent upon the specific deposition conditions and surfaces states of the underlying materials have also been extensively studied. Film qualities such as higher density, lower wet etch rate, reduced film shrinkage, and improved gap fill, were all found to improve as pressure increased from sub-atmospheric to atmospheric, as deposition temperature increased, and as TEOS:Ozone ratios decreased in the CVD process.

In 1994, West et al, first studied the behavior of the atmospheric pressure CVD (APCVD) process using TEOS:Ozone to deposit films on the underlayers of trench isolation modules, namely $Si_3N_4$, thermal oxide, and bare silicon. Deposition rates were shown to vary as a function of surface states: i.e. surfaces that are non-treated, plasma fluorine and plasma chlorine treated. This work demonstrated that TEOS:Ozone selective deposition for trench isolation was feasible, but the presence of fluorine was shown to dramatically modify the deposition rates from the high ozone regime, more than doubling the deposition rate of the $Si_3N_4$.

FIG. 1 shows a typical cross section of a structure on a semiconductor substrate, captured after a series of process steps. Trenches are formed between the interconnecting lines or device features, and these trenches are filled by depositing an insulating material, called "trench isolation" and/or "trench fill oxide" in order to isolate the lines or features. Prior art trench isolation processes typically consist of a sequence of laying down a pad oxide layer, followed by a mask nitride layer, which is then etched through to form trenches in the silicon substrate. An oxide layer is grown onto the trench's sidewalls (also called a sidewall or oxide liner or a thermal oxide), and subsequently the trench is filled by depositing an oxide. The film is then annealed and planarized.

This prior art process creates the sidewall liner prior to filling the trench with a deposited oxide. This technique can result in a poor quality oxide layer fill in the trench or gap. This poor quality gap fill is shown in FIGS. 2a and 2b. Specifically, variable trench sidewall oxidation rates occur due to crystal orientation effects on oxidation rates and the oxidation-related viscoelastic stress. This can cause higher oxidation rates at the top of the trenches compared to the bottom/base of the trenches, and when combined with near vertical (i.e. about 80–85°) sidewall angles which provide a vertical to re-entrant sidewall profile that cannot be filled without leaving voids during the trench fill oxide deposition process.

In addition, growth of the oxide liner prior to the deposited oxide often results in a stress mismatch between the deposited trench fill oxide and the liner, and during later process steps causes cracks, or increased wet etch rate, between the film layers.

As the density of devices packed on a semiconductor substrate increase, the aspect ratio of the gaps or trenches also increases. To fill gaps and/or trenches of approximately 3:1 aspect ratio with spaces <0.25 micron, the use of a technique known as High Density Plasma (HDP) has been used in the prior art. While much effort has been spent on HDP, this technique has not shown the capability to provide good quality films beyond 3:1 aspect ratios, nor has it been successful with re-entrant structures. Further, the HDP process often damages the wafer.

Another gap fill technique that has been used is the Spin-On-Glass (SOG) process by which a liquid is applied to the semiconductor structures, spun at high speed to distribute the material across the structures, then heat treated to cure or stabilize the resultant film. This technique shows excellent gap fill capability but adversely suffers excessive shrinkage of the material due to the required heat treatment and is therefore not acceptable as an isolation material.

Another prior art technique known as the dispersion or showerhead CVD process, such as that described in WIPO Patent Application No. WO98/03991 has been used, but is limited and cannot fill structures of greater than 3 to 4:1 aspect ratios at or below 0.25 micron gaps. This prior art technique has utilized a "showerhead" reactant distribution in which the reactants are pre-mixed prior to delivery through a showerhead type injector. The lack of precise control over the delivery of the reactants and subsequent oligomer formation and removal, causes voids in films deposited on structures having greater than 4:1 aspect ratios.

Additionally a dispersion head atmospheric pressure CVD (APCVD) process is known as a gap fill process, but it also suffers from the same gap fill limitations as the showerhead process in that the intermediate reactants are pre-mixed, and precise control of the reactants is not possible.

As illustrated by the aforementioned limitations of the prior art techniques, there is a need for an improved process for trench isolation.

REFERENCES

Elbel et al, "A New STI Process Based on Selective Oxide Deposition," 1998 Symposium on VLSI Technology Digest of Technical Papers, IEEE, page 208.

Elbel et al, "Method of Producing a Buried, Laterally Insulated Zone of Very High Conductivity in a Semiconductor Substrate," International Patent Application PCT/DE97/01542, filed Jul. 22, 1997; international disclosure date Jan. 29, 1998.

West et al, "APCVD TEOS:Ozone Thin Film Integration into Multilevel Interconnect Process Modules," VMIC (1994).

Fischer et al, "Global Planarization by Selective Deposition of Ozone/TEOS," 1995 VMIC Conference, page 247.

Suzuki et al, "Method of Producing semiconductor integrated circuit device having interlayer insulating film covering substrate," U.S. Pat. No. 5,491,108, Feb. 13, 1996.

Bohr, Mark, "Isolation structure formation for semiconductor circuit fabrication," U.S. Pat. No. 5,536,675, Jul. 16, 1996.

Kameyama, "Method for manufacturing semiconductor device," U.S. Pat. No. 4,472,240, Sep. 18, 1984.

Grassl et al, "Process for Planarizing a Substrate Surface," International Patent Application PCT/EP97/04697, filed Aug. 28, 1997; International disclosure date Mar. 5, 1998.

Vassiliev V. et al., "Properties and Gap Fill Capability of HDP-PSG Films for 0.18 micron Device Applications and Beyond, Dumic Conf 1999, pp. 235–244.

Nag S. et al., "Comparative Evaluation of Gap Fill Dielectrics in Shallow Trench Isolation for Sub 0.25 microns Technologies IEDM, 1996, pp. 841–844.

Xia L-Q. et al., "Selective Oxide Deposition for Shallow Trench Isolation.

SUMMARY OF THE INVENTION

Accordingly, it is an object of the present invention to provide an improved method of trench isolation.

The inventors have discovered a trench isolation method whereby contrary to the prior art, the trench is filled first with a deposited oxide layer (i.e. the trench fill oxide), and because the oxide liner (which is non-conformal) is not present on the sidewalls of the trench, the trench fill is more likely to be void free. Deposition at atmospheric or near atmospheric (200 Ton or 1 atm) pressure using linear reactant delivery also improves the trench fill, as compared to sub-atmospheric dispersion reactant delivery trench fill depositions. After the deposition of the trench fill oxide, the substrate is placed in a densification/oxidation tube furnace or Rapid Thermal Process (RTP) system where growth of a thermal oxide layer or liner occurs on the sidewalls of the trench (the thermal oxide layer or liner is also referred to as a "sidewall liner" or "thermal oxide liner"). In a preferred embodiment of the present invention, growth of the thermal and densification are performed simultaneously.

A key aspect of the present invention is thus the order of the process steps and the combination of two effects (growth of the thermal oxide and film densification) into one process step, with a resulting significant and unexpected improvement in the ability to ensure void free gaps.

In another aspect of the present invention is a method of forming a film on the surface of a semiconductor substrate having one or more trench isolation structures with sidewalls formed thereon, comprising the steps of: depositing an oxide film by chemical vapor deposition (CVD) using ozone and a silicon containing reactant atop the trench structure and sidewalls; and after the depositing step, growing a thermal oxide on the surface of the sidewalls. Preferably, any native or chemical oxide is removed from the side walls which improves the surface selectivity. Preferably the film is densified while growing the thermal oxide.

In yet another aspect of the present invention the step of depositing an oxide film in the trenches is carried out such that the oxide film may be conformal, near-conformal, or non-conformal. Further, the present invention provides for the formation of a substantially planar surface which acts to reduce the complexity of subsequent chemical mechanical planarization (CMP) process, and in some instances may eliminate the need for CMP altogether.

BRIEF DESCRIPTION OF THE DRAWINGS

Other objects and advantages of the invention become apparent upon reading of the detailed description of the invention, and the appended claims provided below, and upon reference to the drawings, in which:

DETAILED DESCRIPTION OF THE INVENTION

Of particular advantage the inventors have discovered a method whereby the trench is filled first with a CVD deposited oxide, and because the non-conformal thermal oxide layer is not present on the sidewalls of the trench, the deposited oxide layer filling the trench is more likely to be void free. After the deposition of the trench fill oxide layer in the trench, the thermal oxide layer is grown on the sidewalls of the trench (also referred to as a sidewall liner or oxide liner). The thermal oxide may be formed by a number of processes; however, in the preferred embodiment the substrate is placed in a densification/oxidation tube furnace or Rapid Thermal Process (RTP) system where the sidewall liner growth and densification of the deposited film are performed simultaneously.

The trench isolation structure may be formed by known methods well described in the prior art. Typically the trench is formed by etching through a nitride etch stop layer, a stress relief layer and into the silicon substrate. According to the present invention, the oxide layer is preferably deposited by chemical vapor deposition (CVD) at atmospheric or near atmospheric pressure, and most preferably at a pressure in the range of about 200 Torr to 1200 Torr, using a linear distribution of the reactants. Generally the CVD process will employ TEOS and ozone as reactants to deposit the oxide film; however, other silicon containing reactants may be used such as silane, OMTS and the like. Of particular advantage, which is discussed in detail below, the step of depositing may be selected according to the invention to deposit any one of a conformal, near-conformal, or non-conformal oxide layer on the trench structure. Preferably, the CVD process will be carried out using a linear injector, such as the type described in U.S. Pat. No. 5,683,516, the entire disclosure of which is hereby incorporated by reference.

Figure 1:
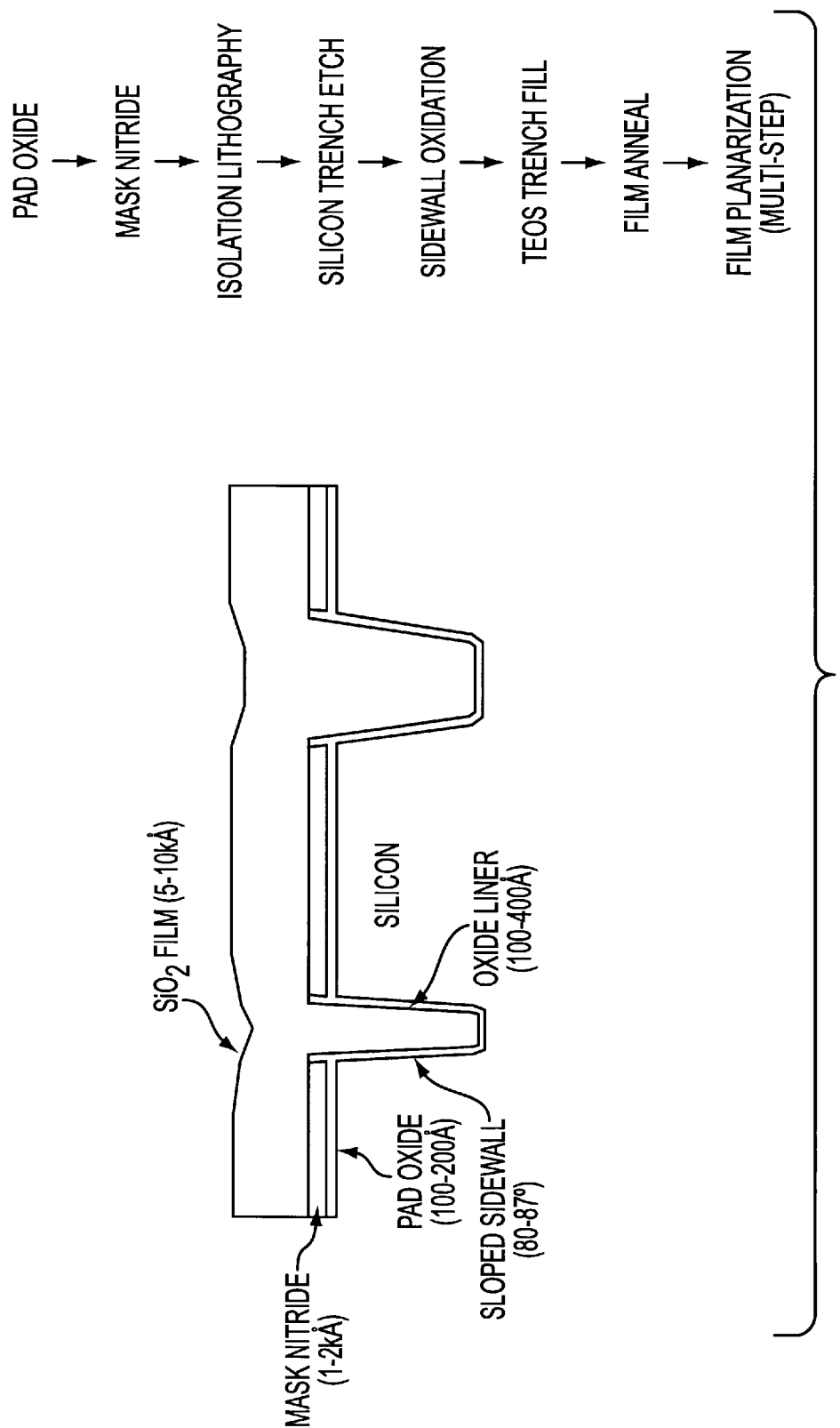
FIG. 1 is an example of a prior art trench isolation process.
Figure 2A:
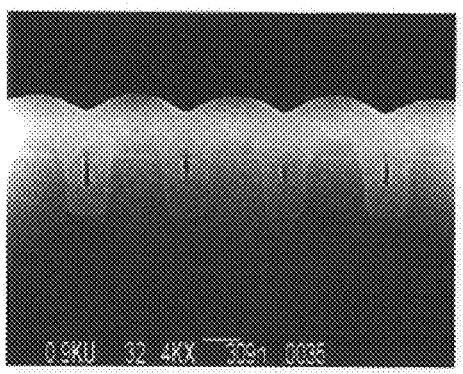
FIGS. 2a and 2b illustrate an example of poor gap fill at two different temperatures, as achieved with the prior art.
Figure 2B:
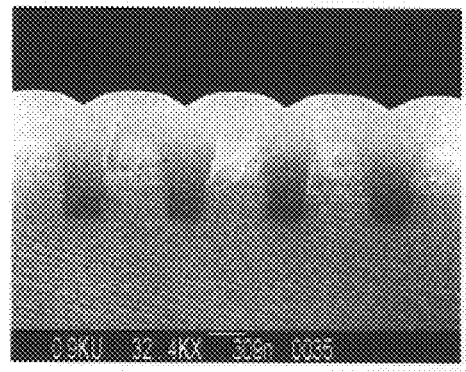
Figures 3, 5:
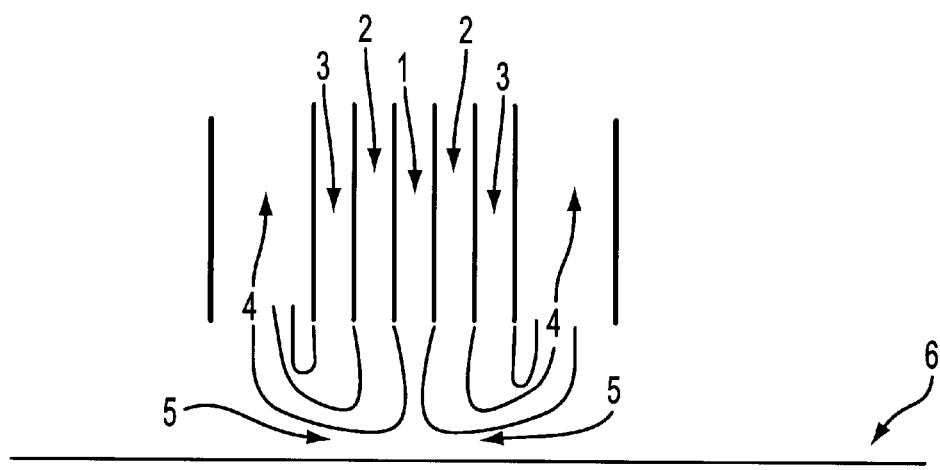
FIGS. 3 and 4 show etch rates and gap fill, respectively, for various materials.
FIG. 5 is a simplified schematic diagram of the injector of FIG. 6 illustrating the gas flows.
Figure 4:
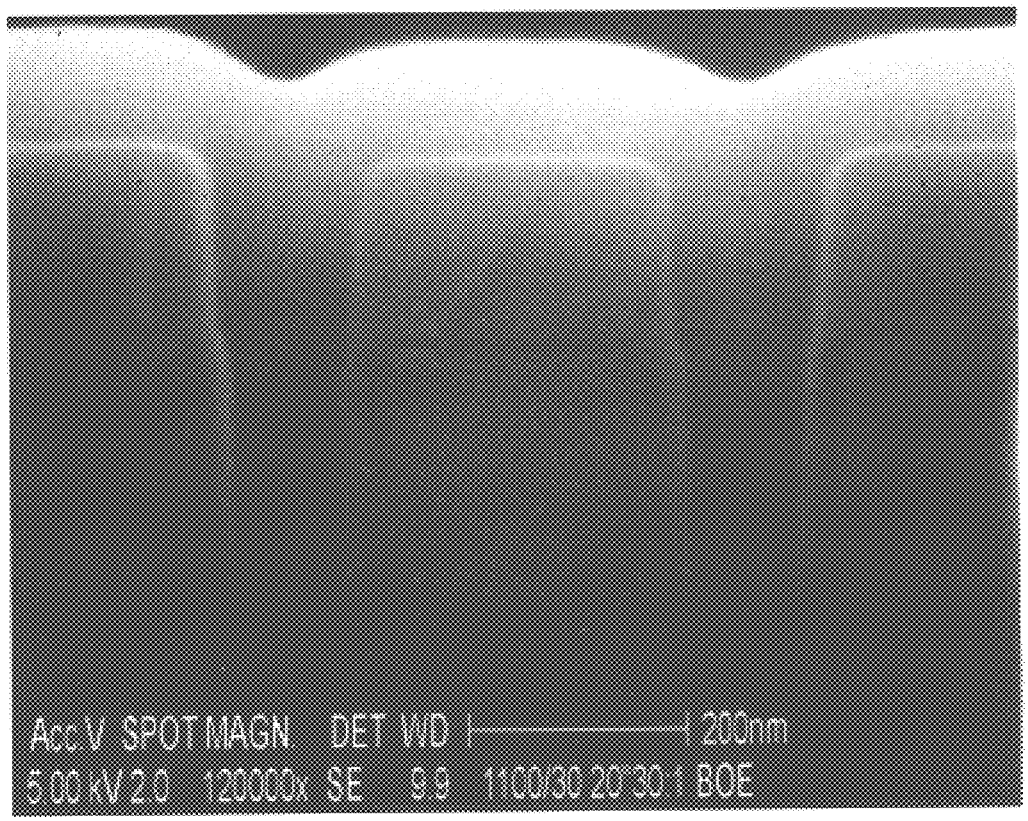
Figure 6:
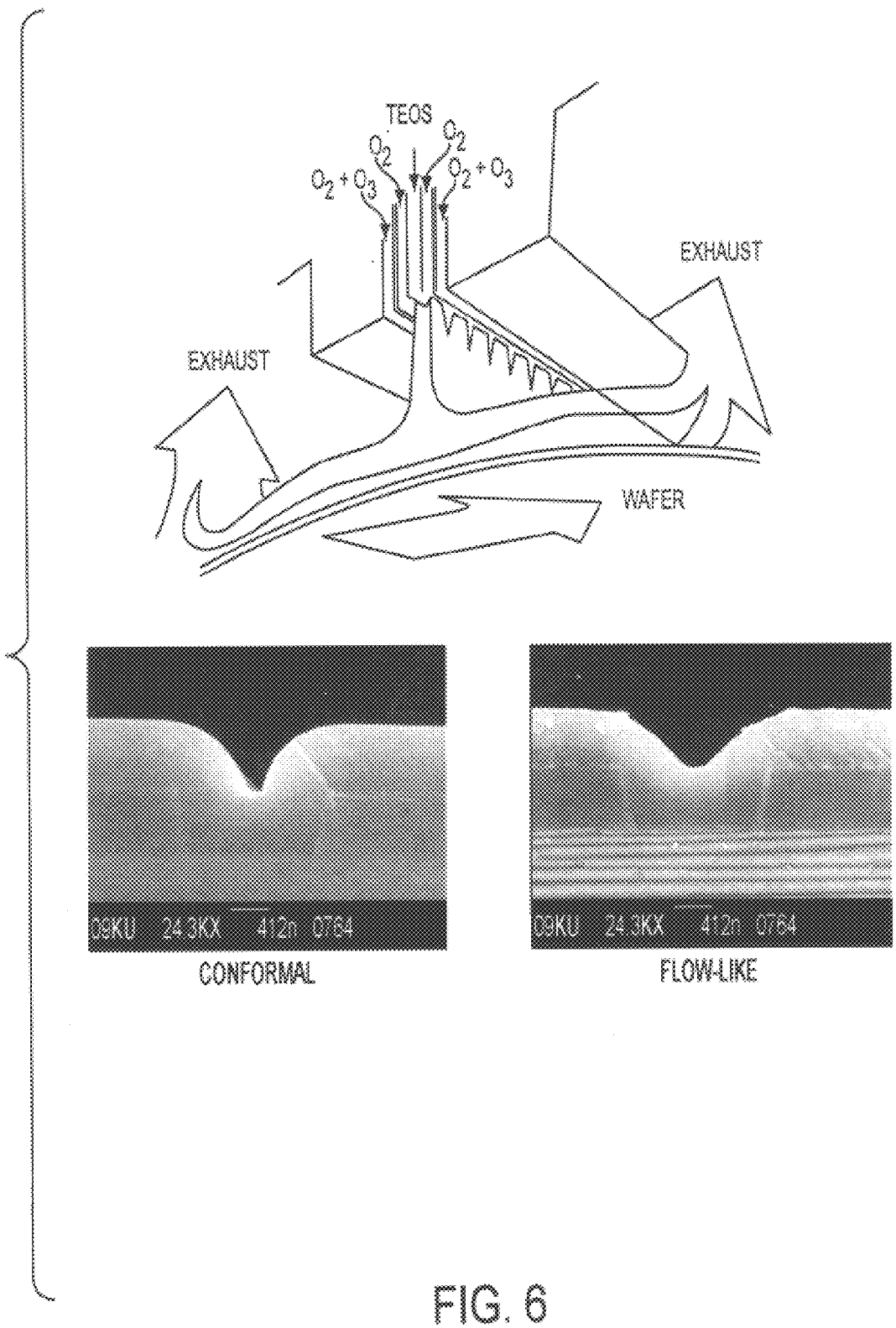
FIG. 6 is an elevated bottom view of an injector which is preferably employed with the method of the present invention.

Performing the deposition step at atmospheric or near atmospheric pressure provides improved gap fill due to longer gas residence time over the wafer/structures. This results in desirable and controlled oligomer formation, which lead to a species that has a low sticking coefficient, which provides for filling the trench (and other) structures from the bottom up. Of further advantage, the use of a linear injector, as shown in FIGS. 5 and 6, provides a narrow deposition zone to precisely mix and deliver the reactants just above the wafer surface. The linear design allows for the reactants to be separated by an inert or non-reactive gas in sheet-like gas flows. This prevention of pre-mixing and the narrow deposition zone (for example, 5 cm on each side of the zone independent of wafer size) allows for very precise control over the oligomer formation which largely contributes to the superior trench gap fill capability. The inventors have discovered that due to reactant depletion across the deposition zone the trench structures are first exposed to a region of extremely advanced oligomer species which provide for advanced trench gap fill capability.

This form of reactant mixing and delivery differs from the prior art technique which utilize showerhead or dispersion head type technology to deliver the reactants.

Comparison between the process of the present invention and the Prior Art are shown in Table 1 below:

TABLE 1

|  | Present Invention | Prior Art |
|---|---|---|
| pre-mix gases | no | yes |
| pressure | 200 Torr–1200 Torr | <600 T typ |
|  |  | ≈200 T |
| dep zone | 5 cm | 10 cm for 200 mm wafer |
| wafer size dependence | no | yes, varies as ½ diameter of wafer size |

Figure 7:
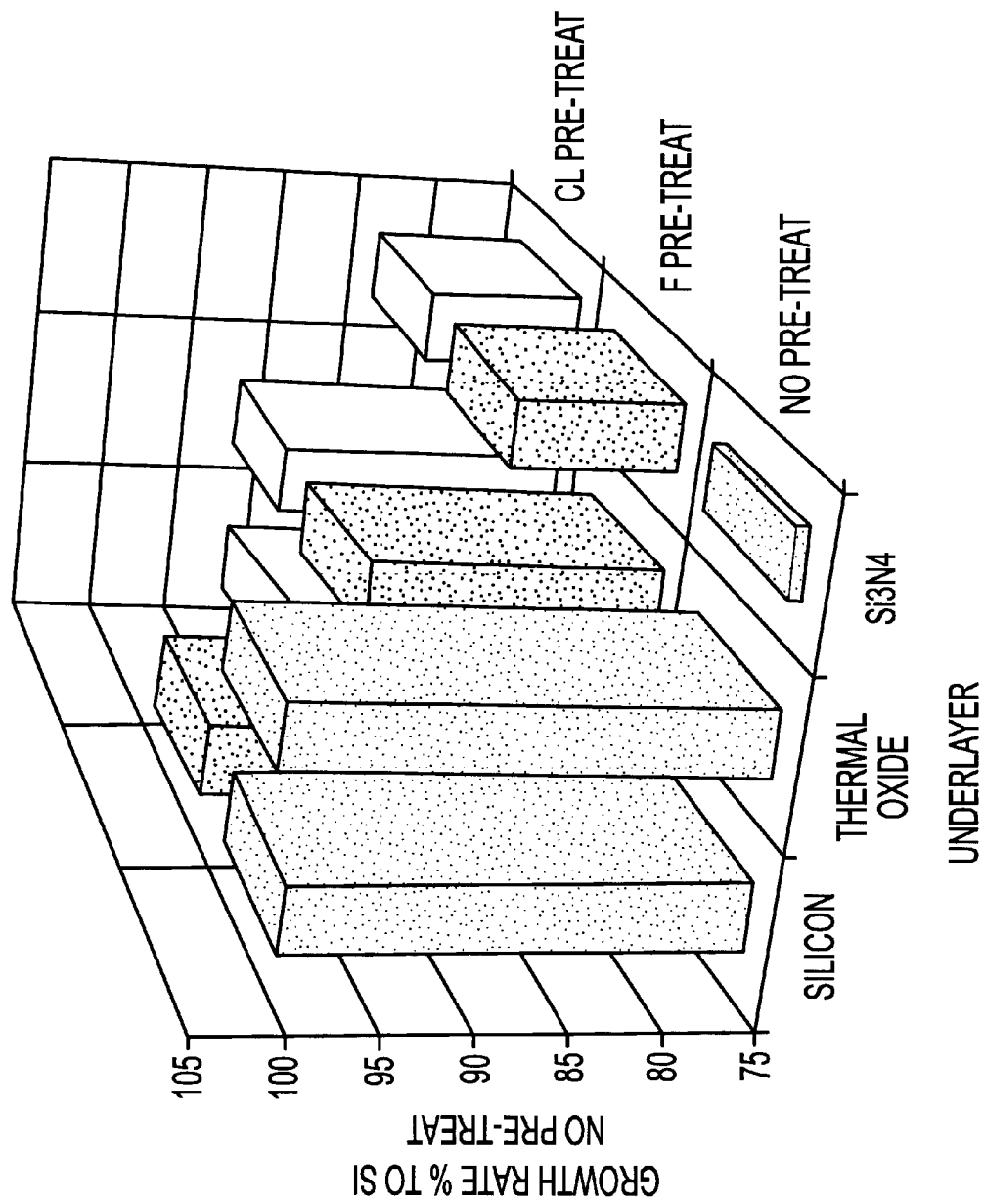
FIGS. 7 and 8 show deposition rate behavior for different materials, and different pre-treatment methods.
Figure 8:
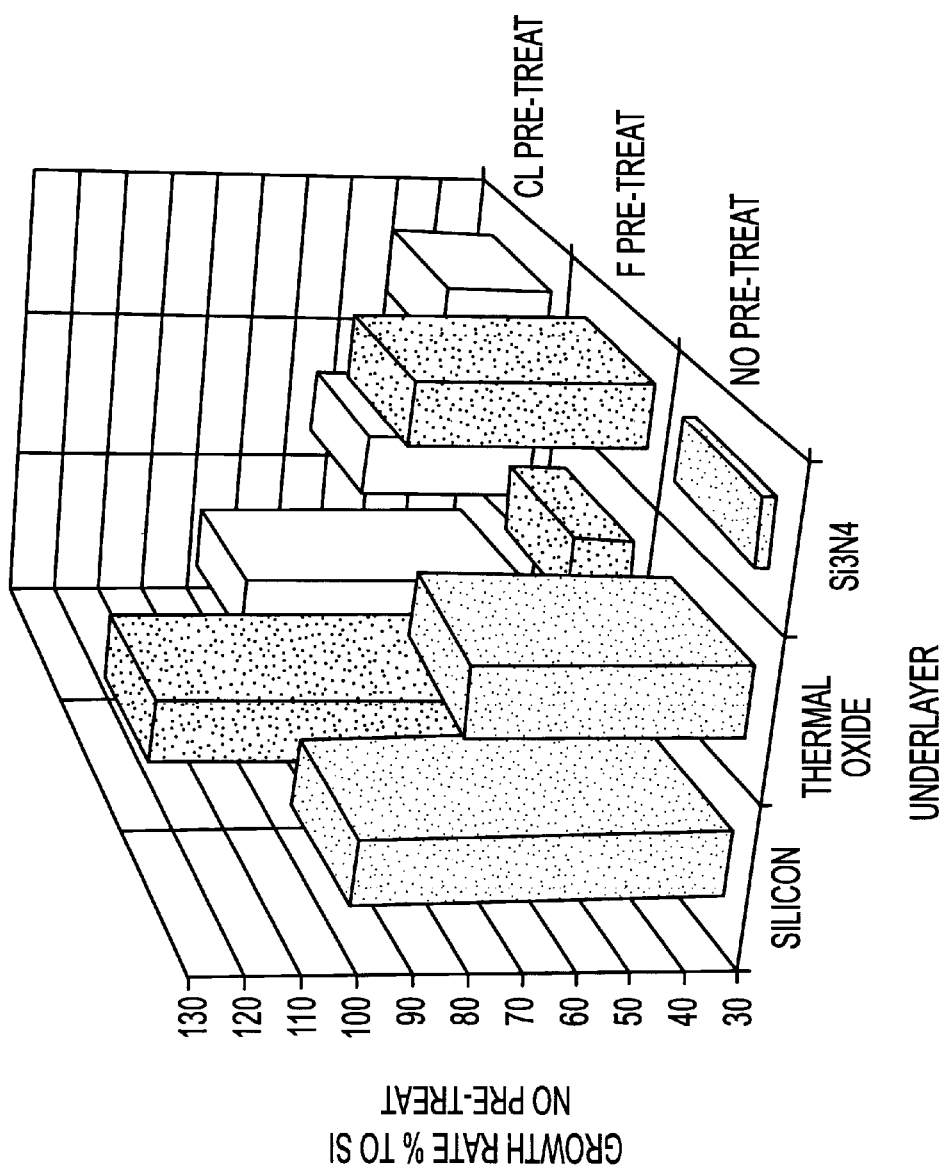
Figure 9A:
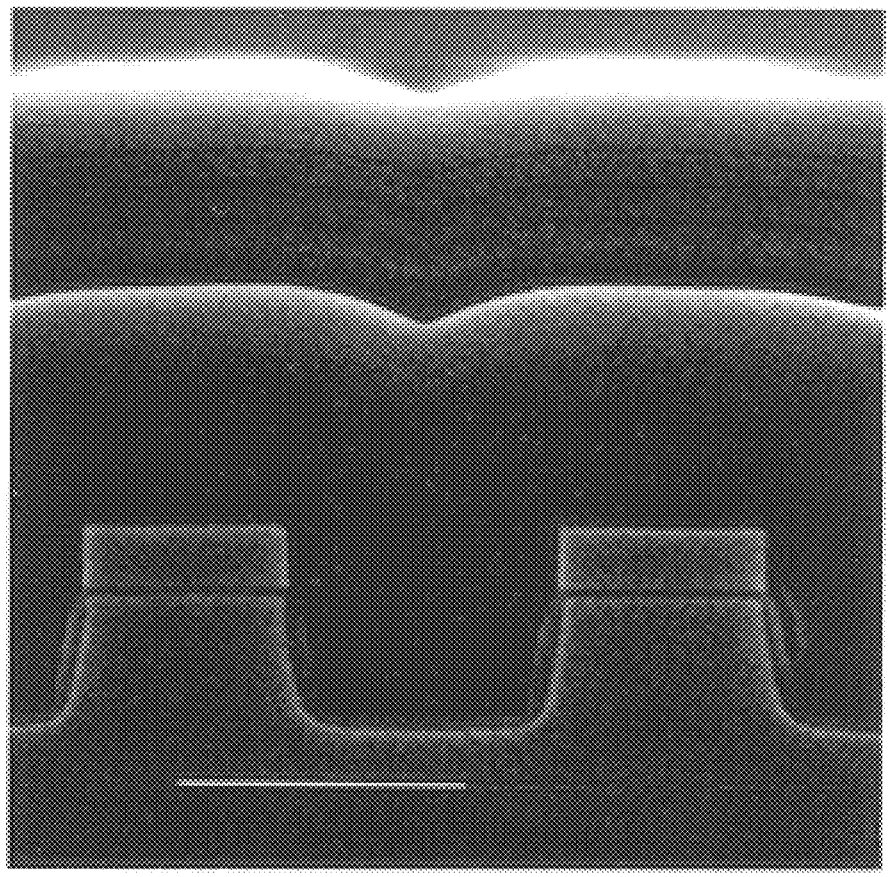
FIGS. 9a, 9b, 10a and 10b show a cross sectional view of a semiconductor device fabricated by conventional techniques, and a SEM photo of the same.
Figure 9B:
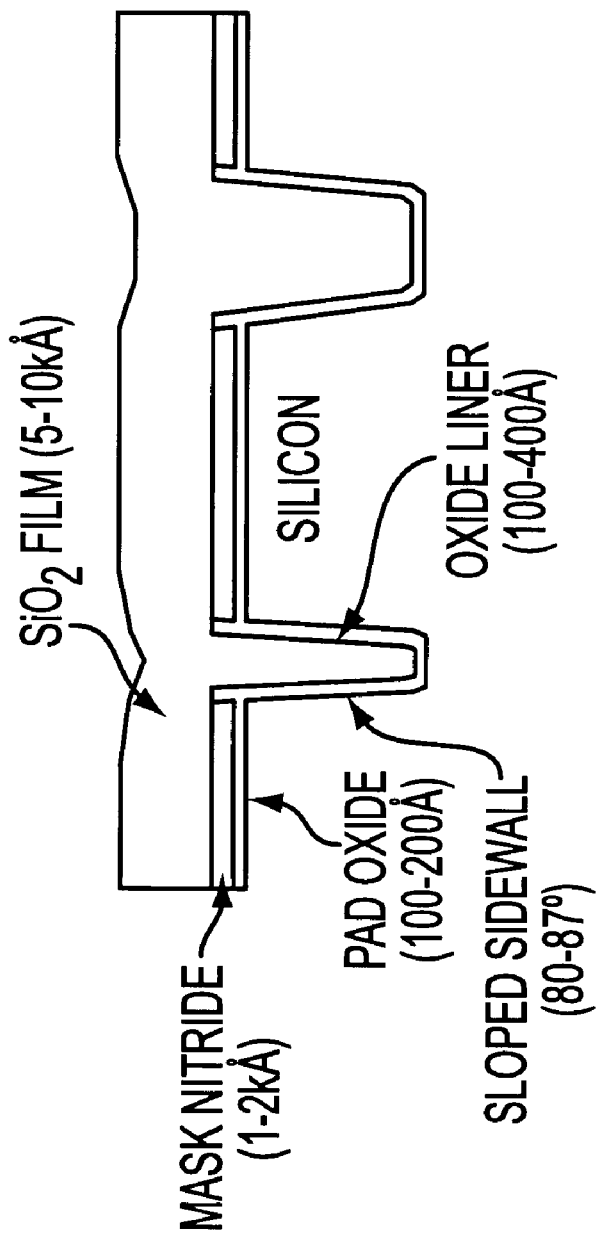
Figure 10A:
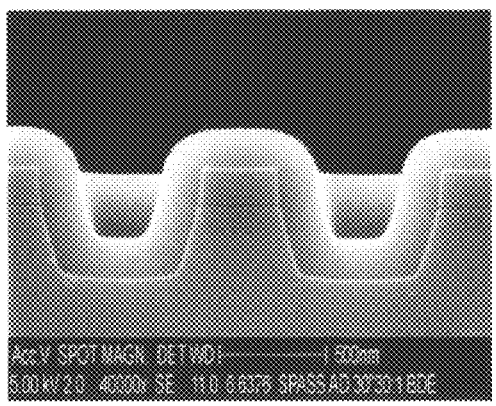
Figure 10B:
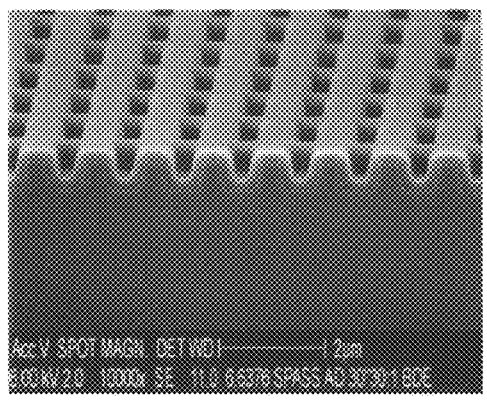
Figure 11A:
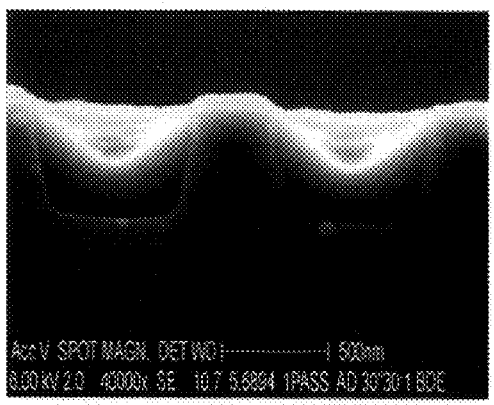
FIGS. 11–12 are scanning electron microscope figures showing the films deposited on wafers at different process conditions according to the present invention.
Figure 11B:
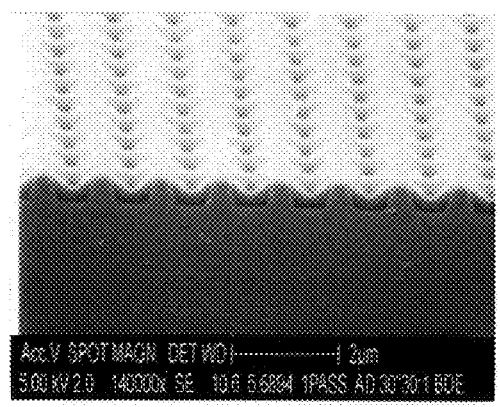
Figure 12A:
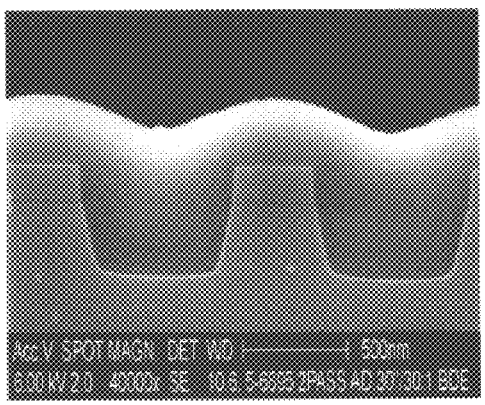
Figure 12B:
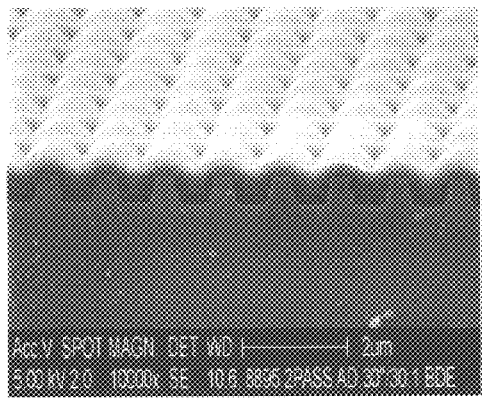
Figure 13:
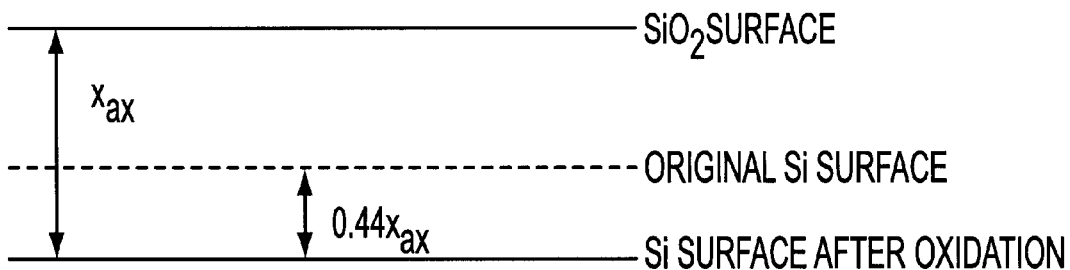
FIG. 13 is a graphical depiction of the oxidation basics of the thermal oxide growth process.
Figure 13:
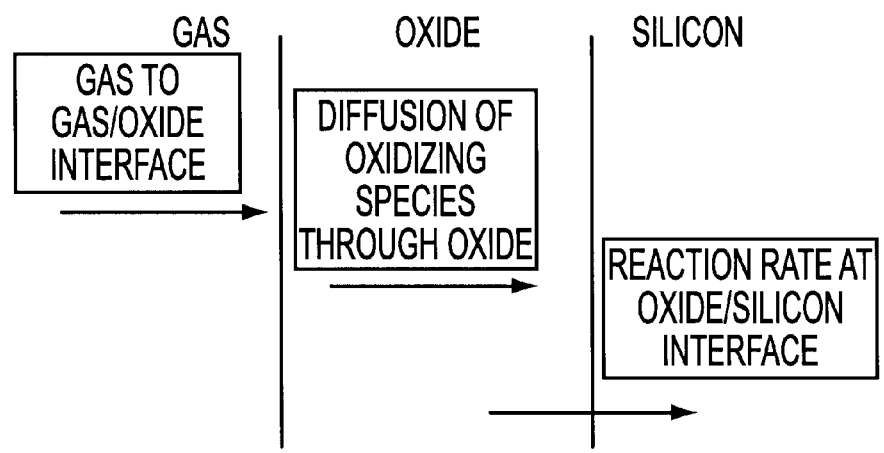
Figure 14A:
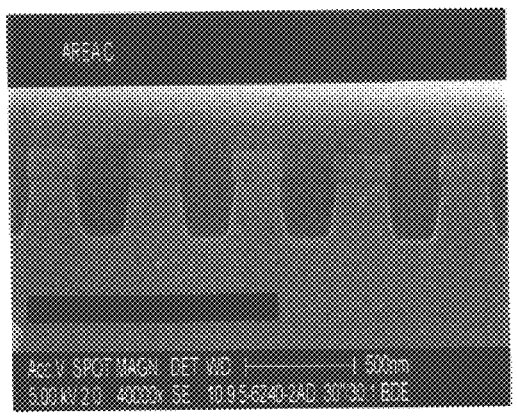
FIG. 14 shows a film deposited at various steps in accordance with the present invention.
Figure 14B:
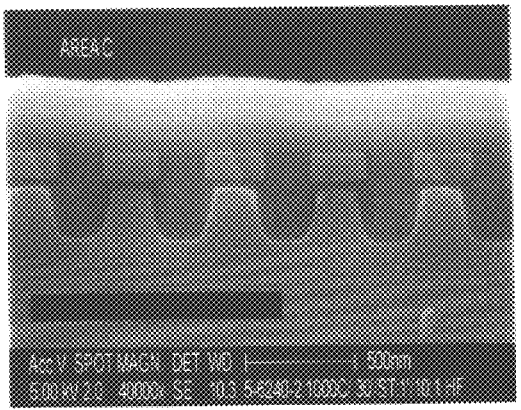
Figure 14C:
Figure 15A:
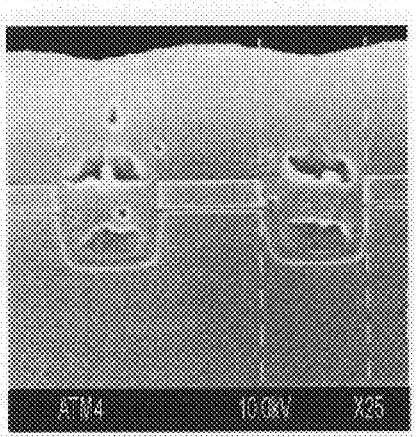
FIGS. 15a to 15c show SEM photos illustrating film quality limitations of conventional processes in the prior art, and a cross sectional of a typical trench structure, respectively.
Figure 15B:
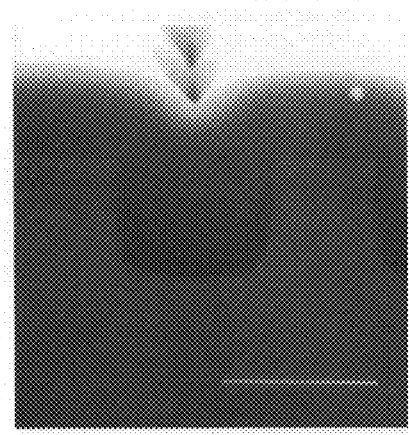
Figure 15C:
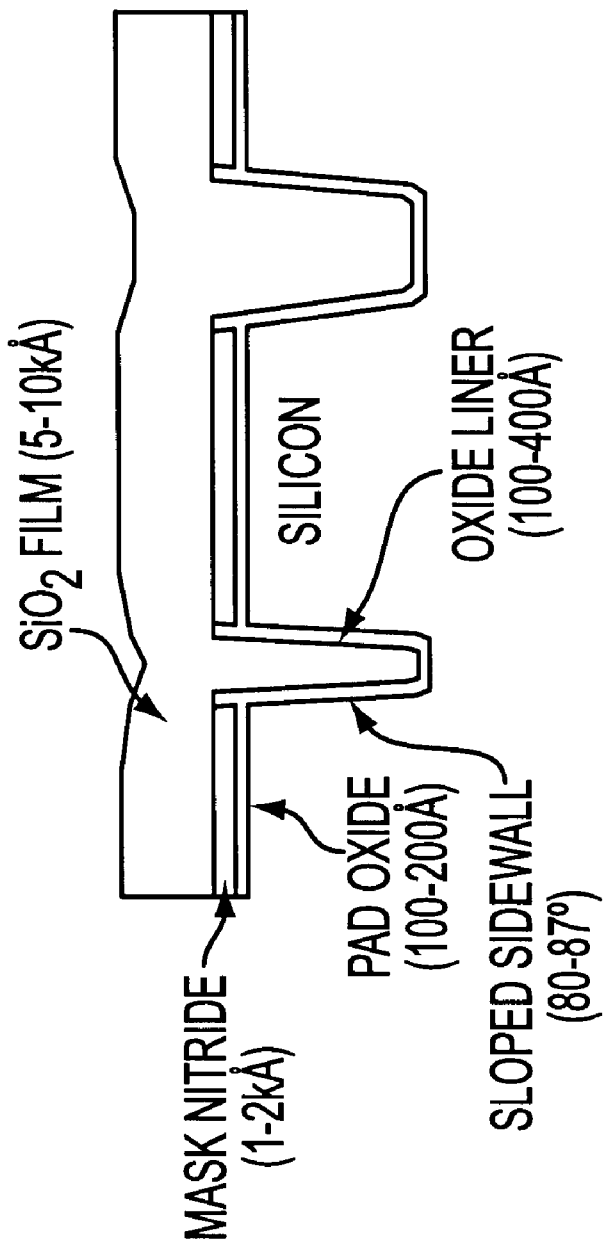
Figure 16:
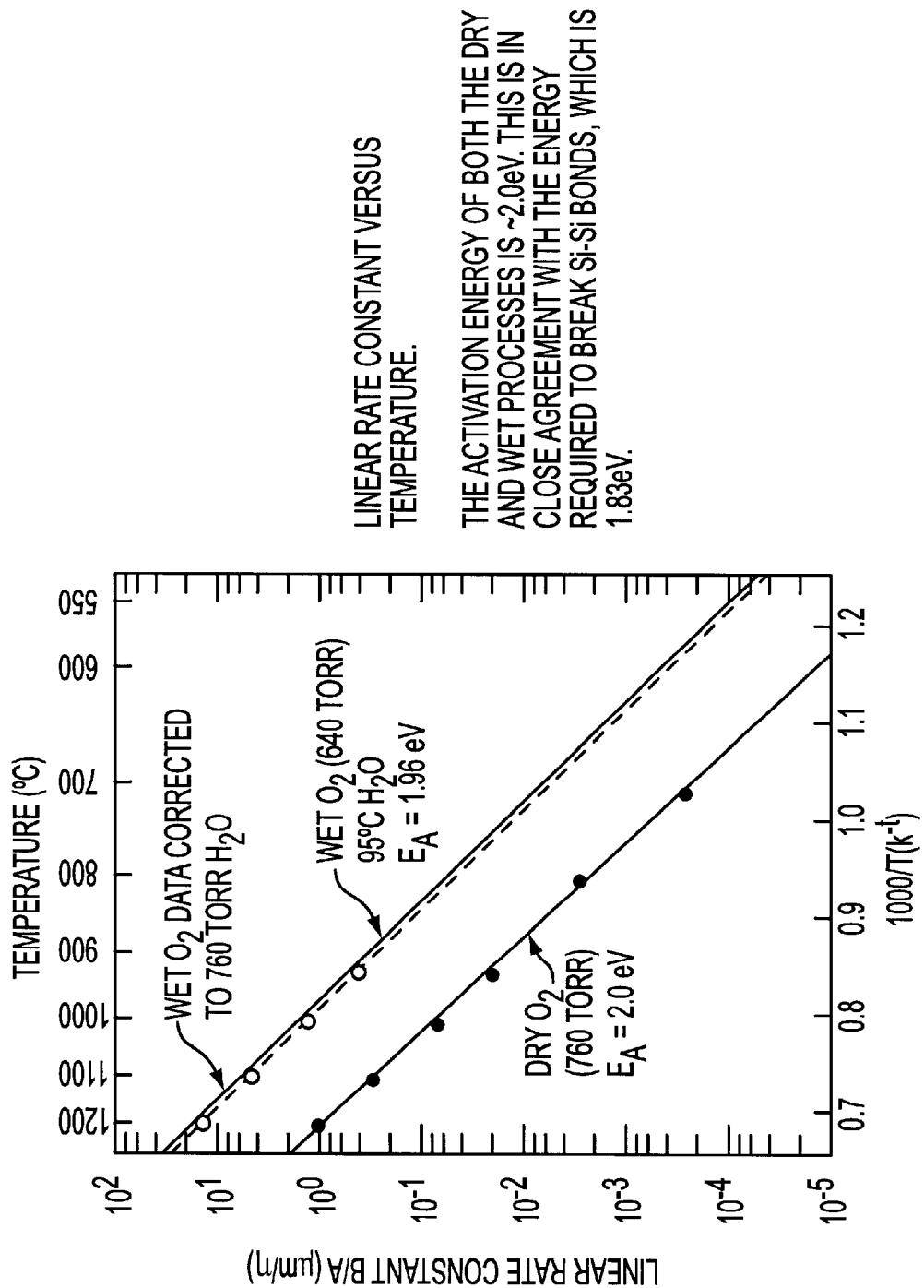
FIGS. 16 and 17 are graphs of linear and parabolic rate constants, respectively, verses temperature for the method of the present invention.
Figure 17:
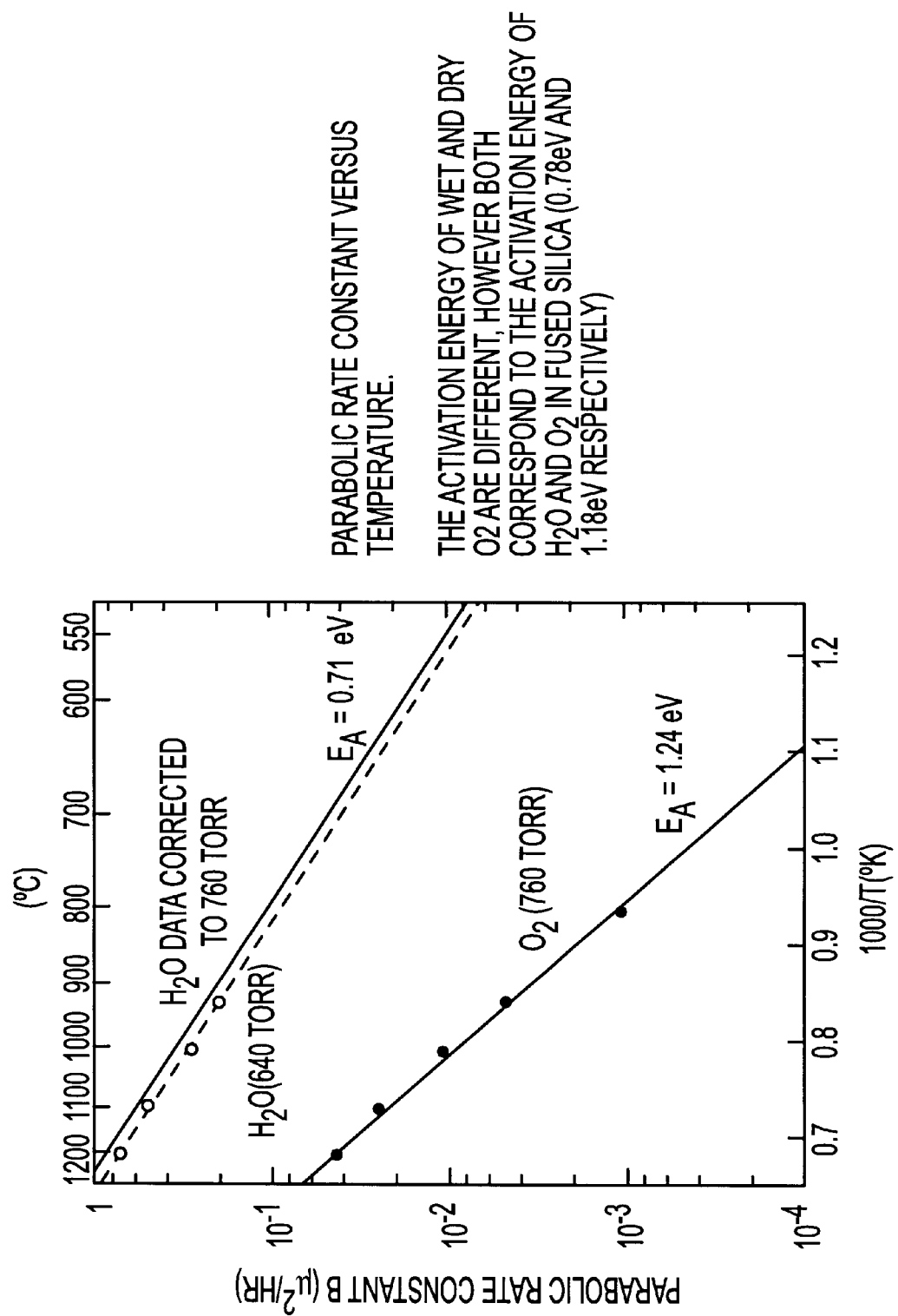

Of particular advantage, the present invention provides a method for filling an isolation trench or other semiconductor structure whose active areas require a non-conductive fill material, typically but not limited to undoped $SiO_2$, to physically and non-conductively isolate said electrically active region(s). Deposition rate behavior is shown in FIGS. 7–8 and the results of films deposited by the method of the present invention are shown in FIGS. 11–12.

The films are preferably deposited by an atmospheric to near atmospheric Ozone/TEOS CVD process, or from an alternate source of silicon, with or without additional reactants (dopants) with a specific gas injection and mixing apparatus combined with rapid withdrawal of the oligomer formation to finitely control the reactant mixture presented to the semiconductor structures. The ability of the present invention to fill both low and high (i.e. greater than 5:1) aspect ratio, and wide to narrow (i.e. less than 0.25 micron) gaps or trenches with sidewall angle structures that include: non vertical, vertical, and with or without re-entrant side walls, provides a significant advantage. This is particularly of great interest since such desired gap fill is achieved with a non-plasma process. Prior to the present invention, the non-plasma process has proven difficult to fill such structures with a void-free, high quality, non-conductive oxide. Achieving such a desirable result according to the method of the present invention has not previously been reported.

More particularly, the present invention provides a CVD process that preferably provides the unique ability to fill trench structures in the as-deposited state, where the trench structures have an aspect ratio of 2:1 and greater, and further up to equal to or greater than 5:1, and have vertical to re-entrant sidewall structures, along with width openings or gaps of equal to or less than 0.25 micron.

The present invention provides this high quality void-free oxide film suitable for providing isolation between electrically active regions of the semiconductor device by the following method steps: First, ozone and/or oxygen and TEOS, or another suitable organic or non-organic silicon source, are delivered to a reaction chamber in discrete input paths preventing reaction of these precursors until after their delivery to the reaction chamber. In the preferred embodiment, the precursors are delivered by a linear gas injector and system as shown in part in FIGS. 5 and 6, and further described in U.S. Pat. Nos. 5,683,516 and 6,022,414, the disclosures of both are hereby incorporated by reference in their entirety.

Specifically, as shown in FIG. 5 a plurality of passages are provided which independently convey the gases to the surface of a wafer or substrate 6. The input path of the gases are typically as follows: ozone are oxygen are conveyed via passage 1. TEOS, or another silicon precursor are conveyed via two passages 2, separated by the ozone/oxygen path 1. On each side of the TEOS/Si source passage, nitrogen, or alternatively more ozone/oxygen are conveyed in passages 3. The gases exit the injector, mix and react to form a layer of material on the surface of the substrate. Unreacted gases and by-products are exhausted from the system via exhaust passages 4. This linear gas flow delivery is further illustrated by the injector 10 in FIG. 6.

The method is carried out at a pressure in the range of about 200 Torr to 1200 Torr, and preferably at atmospheric or near atmospheric pressure. Wafers or substrates with gap fill requirement structures (i.e. trench structures and the like) are moved into the deposition area of a process chamber housing the injector, while being heated to about 300° C. to 600° C. The ozone and TEOS gases (or other silicon source) are delivered such that the TEOS diffuses through a boundary layer of ozone as shown in FIGS. 5 and 6, producing a desirable oligomer formation which is conducive to void-free gap fill in high aspect ratio vertical to re-entrant sidewall structures. The method according to the present invention is particularly suited for use with structures having a trench etched in silicon, with silicon being the exposed sidewall material and with $Si_3N_4$ or other hydrophilic material residing on the top and in between the trenches. It is also suited for void-free gap fill into structures that are completely overcoated with $Si_3N_4$ or other materials.

The present invention therefore devises a gap fill process by deposition of a dielectric silicon dioxide or derivative thereof by manipulation of an ozone:TEOS process, which in contrast to the known gap fill techniques offers a vastly improved non-damaging gap fill capability with a high quality oxide.

In addition, the deposition process also provides for extremely uniform deposition rates over the various varying width lines or areas of the uppermost layers/materials present in the various trench or gap fill structures.

Further advantages include, but are not limited to the following: Improved and void free oxide layer trench fill compared to the conventional/previous techniques and differs by depositing the oxide fill layer: prior to the sidewall liner growth, and at atmospheric pressure. Extension of trench fill to sub 0.13 micron technologies with near vertical to vertical sidewall profiles is possible with the method of the present invention. Oxide fill densification and sidewall liner growth are preferably combined into a single step, saving at least one additional step in the trench process module. Further, the method of the present invention allows for more vertical sidewall profile at the silicon etch step-simplifying the etch process as trench widths reduce.

Figure 18A:
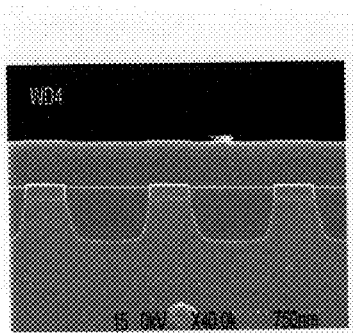
FIGS. 18a to 18c show films deposited with the method of the present invention at post CMP planarization.
Figure 18B:
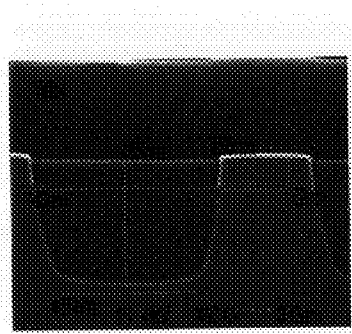
Figure 18C:
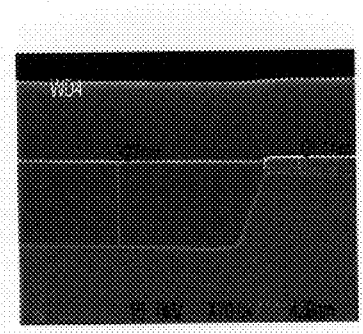

Substantially void free deposition of the oxide layer in the trench structures is highly desirable to ensure that good electrical characteristics and high device reliability in the end product, and the combination of thermal oxide liner growth and densification of the deposited oxide results in significant cost savings, and reduction of production cycle time. Of particular advantage, pre-CMP planarity is significantly improved by the method of the present invention, thereby minimizing the need for additional planarization techniques to avoid CMP dishing. FIGS. 18a to 18c show the substantially planar surface formed by the deposited oxide and the minimal effect from dishing. Since thermal oxide growth takes place at the interface of the silicon substrate and CVD oxide, the interfacial stresses, as well as the within-trench stress, is significantly reduced. This reduction of the interfacial stress eliminates higher wet etch rates near the trench wall, which reduces problems such as poly wrapping.

Another advantage of the present invention is the capability to deposit both conformal (i.e. non-selective) or non-conformal (i.e. selective) oxide layers. Thus, the method of the present invention allows one to select the type of oxide film desired. For example, a selective (i.e. non-conformal) film may be desired, which deposits a substantially planar film. This substantially planar film reduces the amount of chemical mechanical polishing (CMP) required, and for some applications may eliminate the need for CMP altogether with or without application of another etch method.

To deposit such films in the trench structure the CVD process is preferably carried out in an atmospheric pressure, or near atmospheric pressure, CVD system with a linear type injector, such as that described in U.S. Pat. No. 6,022,414, the entire disclosure of which is hereby incorporated by reference in its entirety. The CVD process is carried out with an ozone to silicon containing gas (reactant) ratio in the range of about 5 to 200. To deposit a conformal, non-selective film, the deposition reaction is carried out at a temperature in the range of approximately 300 to 500° C., with a temperature of approximately 500° C. being preferred. To deposit a non-conformal, selective film, the deposition reaction is carried out at a temperature in the ranges of approximately 350 to 450° C., with a temperature of approximately 400° C. being preferred.

Of particular advantage, the method of the present invention preferably provides for growing the thermal oxide liner on the sidewalls of the trenches, and densifying the deposited oxide in one process step i.e. in one annealing step. Combining these two steps into one is not simply a summation of the two steps, but is a complicated process. Specifically the one process step has the following variables: an oxidizing agent is provided such as, but not limited to, oxygen and stream, to initiate the liner growth at the side walls of the trench. Second, preferably although not necessarily, silicon migration or corner rounding is promoted by using a halogen ambient agent such as $H_2/Cl$. Corner rounding is a known techniques, as described in Nandakumar, M, et al., "Shallow Trench Isolation for advanced ULSI CMOS Technologies," 0-7803-4777-3/98, IEEE, 1998. Third, the temperature is controlled to provide densification of the deposited oxide as described below. This is described further below and in the experimental section.

This thermal oxide growth and densification step can be carried out in a variety of systems such as a vertical or horizontal furnace, such as a single wafer furnace tool, or in rapid thermal processing (RTP) system. Preferably, the thermal oxide growth is conducted in an anneal step carried out at a temperature in the range of about 700 to 1200 C., for a period of time in the range of about 5 to 300 minutes, and in a 50% oxygen environment when using a furnace. When using a RTP system, the time is preferably in the range of about 30 seconds to 10 minutes. Alternatively, a steam environment in combination with nitrogen, hydrogen, oxygen or other gases may be used. The time will vary depending on the thickness of the film, and preferably is in the range of 100 to 200 minutes. Specific examples are reported in the Experimental section below.

Preferably, the thermal oxide growth and densification steps are combined into one operation, wherein annealing provides both the thermal liner growth and densify the film. This provides a cost and time savings and thus assists in reducing the cost of ownership (CoO) of the silicon trench isolation (STI) process. In this instance where the two steps are combined, the inventors believe that while the film is being densified under an oxygen ambient, oxygen molecules diffuse through the film to react with the silicon substrate. A silicon dioxide layer (i.e. the thermal oxide) is formed by oxidizing the silicon substrate at its interface with the film. The thermal oxide growth rates under various process conditions have been investigated. Specifically, film properties such as stress, wet etch rate, refractive index and shrinkage are evaluated and shown in FIGS. 21 to 27, as described in further detail in the experimental section below.

Experimental

A number of experiments were conducted using the method of the present invention. Sample experiments are provided below, and such experiments and date are provided for illustration purposes only, and are not intended to limit the invention in any way. The experiments are divided into two section for clarity. The first section describes experiments regarding deposition of the CVD film and selectivity. The second section describes experiments regarding the thermal oxide growth and densification.

CVD Film and Selectivity

Experiments were conducted to characterize the deposition rate on silicon and silicon nitride surfaces, by growing thin layers of oxide on these surfaces repetitively, and determining the selectivity and critical thickness for surface sensitivity, for a specific process condition.

The experimental objective was to understand the surface sensitivity at one specific process condition. This teaching allows one to conduct routine experiments for other process conditions. The two major process variables for selectivity are the process temperature, and Ozone ($O_3$) to Reactant (R), i.e. silicon containing reactant, ratio. Film thickness is another variable that affects selectivity. The illustrative example process was conducted at 400° C., with a $O_3$:R ratio of 37.5.

A variety of substrates were tested, as follows: (a) Bare Silicon wafers(stripped in 10:1 HF for 2 min. to remove native oxide); (b) Silicon Nitride wafers; and (c) Test wafers (Bare silicon wafers with some native oxide) used for baseline.

The experiments were performed using the following sequence:

1) Load the 400° C. profile, and make adjustments as necessary.
2) Change the MFC for Silicon precursor in Ch. 4 to <200 sccm.
3) Run the CPSPOT2 recipe on regular test wafers in chamber 4 (from the attached run log) with modified chemical flow to achieve low thickness(50 A).
4) Measure the oxide thickness using the Rudolph Ellipsometer. Verify thickness of 50 A on this film.
5) Run 3 stripped bare Si wafers, and 3 nitride monitors using the above recipe.
6) Measure the wafers on Rudolph Ellipsometer using the appropriate program.
7) Repeat steps 5 and 6 until its determined that there is no more surface sensitivity between the bare silicon and silicon nitride surfaces.

Measurements of the resulting film were made as a 9 point thickness measurement using the Rudolph Ellipsometer for the 2 different substrates using different programs. A single data point(at the center) was chosen for data analysis to be consistent.

Figure 19A:
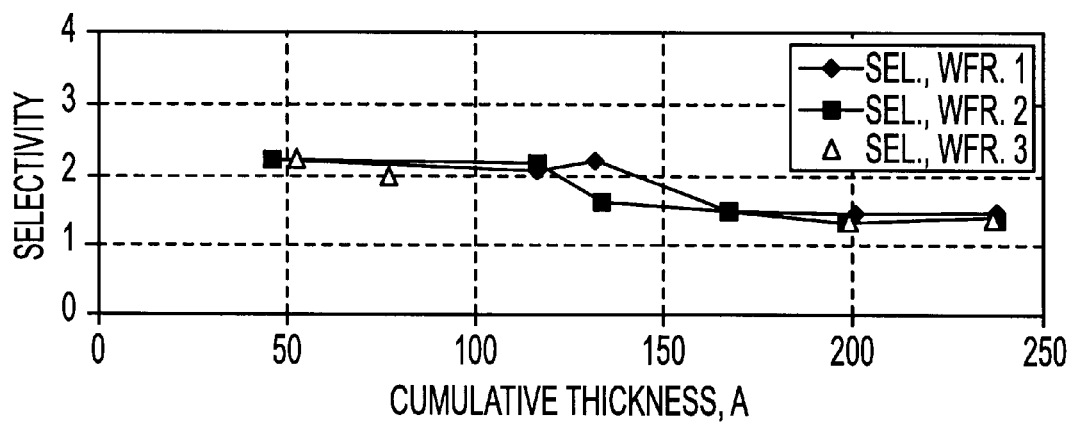
FIGS. 19a and 19b illustrate cumulative thickness (on Si) verses selectivity, and the run number verses cumulative thickness, respectively, for the experiments reported in the Experimental section.
Figure 19B:
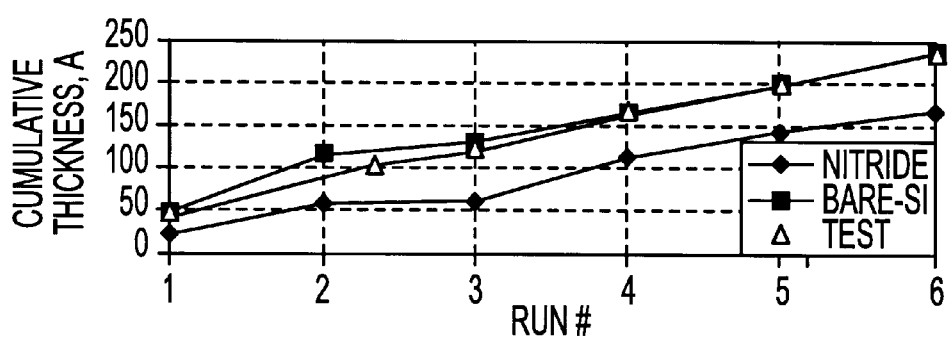

Selectivity is defined as the ratio of deposition rate on silicon to deposition rate on silicon nitride. The results of the selectivity tests are shown in FIGS. 19a and 19b. FIG. 19a shows the cumulative thickness (on SI) versus the selectivity. FIG. 19b shows the run number versus the cumulative thickness.

A number of observations were made as follows: (1) The selectivity is high in the first few seed layers of the oxide. In this case, the selectivity in the first 200 A was about 2.2, and it decays slowly approaching 1 at an infinite thickness; (2) Different process conditions are expected to have different selectivity and different critical thickness; and (3) Selectivity is a function of film thickness apart from the process variables. A thicker film will have lower selectivity compared to a thinner film.

This experiment has shown that selectivity is higher in the first few seed layers defined by the critical thickness. It can also be concluded that selectivity is very specific for a film thickness, and this thickness has to be defined for future tests. The process variables can be used as tuning knobs to control selectivity and critical thickness for the future tests to explore the TEOS/ozone planarization scheme (TOPS) process window.

In summary, the invention provides a method or process for filling gaps or trenches up to and greater than about 5:1 aspect ratio, whose widths are less than about 0.25 micron with sidewall angles ranging from sub-vertical, vertical, and re-entrant.

The materials used in the process that are exposed to the reactant mixture are etched silicon trenches with a top layer of hydrophilic material, such as $Si_3N_4$, thermal oxide, and the like. In another aspect, the semiconductor structures may be entirely over-coated with $Si_3N_4$. Alternatively, the semiconductor structures may by entirely over-coated with a polysilicon epitaxial layer. Preferably, the process is carried out wherein the deposition of the dielectric layer occurs at atmospheric pressure, or near atmospheric pressure. The process further provides a method in which the ozone-activated deposition of $SiO_2$ from a silicon precursor includes ozone activated $SiO_2$ from TEOS on the semiconductor structures.

Thermal Oxide Growth and Densification

The growth of the thermal oxide on the side walls of the trench structures after the trench was filled with a layer of deposited oxide is an important feature of the present invention. Accordingly, the thermal oxide growth theory is considered as illustrated in the following experiments.

To verify the concept of feasibility of oxidation of silicon underneath a CVD Oxide(NSG) film, and do a preliminary study of the growth rate of this thermal oxidation using steam is explored. Also to evaluate the measurement technique of Thermal Oxide on patterned wafers and on Bare-Si wafers with a CVD oxide, and validate the results is discussed.

Tests were done on Bare-Si, Blanket CVD $SiO_2$ films, and patterned STI structures without the thermal oxide, also called a Liner Oxide. A matrix of 3 different CVD $SiO_2$ thickness and 3 annealing conditions using Steam at 1000° C. was chosen for this evaluation. The CVD $SiO_2$ deposition was done using the WJ1000 and the anneal was done using a horizontal tube furnace. The run matrix is shown in the table 2 below.

TABLE 2

| Anneal Time, Min. | CVD SiO2 thickness |
|---|---|
| 15 | 1300 A |
| 30 | 2600 A |
| 90 | 4700 A |

The as-deposited CVD $SiO_2$ thickness and the thermal oxide measurements were done on a Prometrix SM 300. The post-anneal oxide(CVD $SiO_2$+Th. Oxide grown from anneal) measurements was done using the Prometrix and confirmed with SEM's. The thermal oxide thickness on bare silicon was difficult to measure from the SEM's as the CVD oxide quality was matching very closely with thermal oxide quality and it was difficult to delineate between the 2 oxides. However, knowing the shrinkage of the CVD film, we could calculate the Thermal oxide thicknesses from the following equation:

$$X_{Th.\ Ox.} = X_{Total\ (After\ Steam\ Anneal)} - [X_{CVD\ (Before\ Anneal)} - X_{CVD\ Shrinkage}] \quad (1)$$

where X is the thickness.

Also, the thermal oxide thickness in the STI Patterned structure was difficult to measure from the SEM's. An alternate technique which involved the measurements of amount of silicon consumed from the oxidation process was used, and using the basic equations of Thermal Oxidation, the growth of thermal oxide was calculated as below:

Oxide Equation $$\chi_o^2 + A\chi_o = B(t+\tau) \quad (2)$$

where $\chi_o$ = oxide thickness t = time

A = linear oxidation constant

B = parabolic rate constant $\tau$ = time displacement to account for initial oxide layer For long oxidation times, $$\tau \gg \frac{A^2}{4B^\tau} \quad (3)$$

the oxidation equation reduces to: $\chi_o^2 = B\tau$, i.e. parabolic growth law, B=parabolic rate constant. For long oxidation times, the oxidation becomes limited by the rate at which the oxidizing species diffuses through the oxide (diffusion limited). For short oxidation times, $$(t+\tau) \gg \frac{A^2}{4B^\tau} \quad (4)$$

the oxidation equation reduces to $$\chi_o^2 = \frac{B}{A}(t+\tau) \quad (5)$$

i.e. linear growth law, B/A=linear growth constant.

The amount of silicon consumed on the side-walls of the structure was measured from the SEM's of pre and post anneals. The oxide thickness was calculated using the following equation:

$$X_{Th.\ Ox.} = [X_{si\ Cons.}/0.44] \quad (6)$$

The following data illustrated in Table 3 was obtained from the anneal runs for the test matrix. The thermal oxide thickness was measured using equation (1).

TABLE 3

| Conditions for Stm. Anneal | | CVD SiO2 As-Dep | After Steam Anneal | CVD Oxide Shrinkage | Thermal Oxide Thickness |
|---|---|---|---|---|---|
| 90 Min. | 1) | 1425 | 4850 | 50 | 3475 |
|  | 2) | 2649 | 5616 | 100 | 3067 |
|  | 3) | 4517 | 6905 | 150 | 2538 |
| 30 Min. | 1) | 1389 | 2839 | 50 | 1500 |
|  | 2) | 2622 | 3714 | 100 | 1192 |
|  | 3) | 4778 | 5480 | 150 | 852 |
| 15 Min. | 1) | 1312 | 2176 | 50 | 914 |
|  | 2) | 2653 | 3285 | 100 | 732 |
|  | 3) | 4616 | 4983 | 150 | 517 |
| @ 1000° C. | | | | | |

Figure 20:
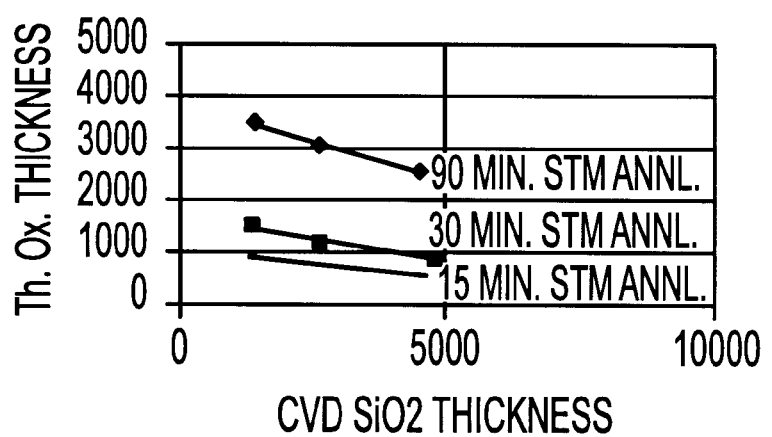
FIG. 20 is a graph of thermal oxide thickness vs. CVD $SiO_2$ thickness.

This data was plotted in Excel and shown in FIG. 20 to understand the relationship between thermal oxide growth and CVD $SiO_2$ thickness for different anneal times. The following observations were made from this data: There was a linear relationship between thermal oxide growth and the CVD oxide thickness, i.e., thermal oxide thickness decreases with increase in CVD oxide thickness in a linear fashion. This is an expected trend. Further, the growth mechanism for thermal oxide is parabolic under a CVD oxide (as expected).

Based on these observations, we tried to curve fit the data using a DOE software called DOE_KISS. CVD $SiO_2$ Thickness, and Anneal Time were the key factors, and the Thermal Oxide thickness was the response. All other anneal factors like Anneal Temperature, and Steam Concentration, and all flows were kept constant for this evaluation.

From the regression analysis, the following coefficients were obtained:

$X_{CVD\ SiO2}$: −290 t: 1053

$X_{CVD\ SiO2} * $ t: −112

Constant: 1642 where $X_{Th.\ Ox}$ . is the Thermal oxide thickness Å

$X_{CVD\ SiO2}$ is the CVD Oxide thickness in Å

T is time in min.

Based on this correlation, the predicted values for the Thermal oxide Thickness are shown below:

a) For $X_{CVD\ SiO2}$=0 Å, and t=15 min.; $X_{Th.\ Ox.}$=1112 Å; the real oxide thickness on a Bare Si wafer is 1154 Å.

b) For $X_{CVD\ SiO2}$=6800 Å, and t=30 min.; $X_{Th.\ Ox.}$=520 Å; the real oxide thickness on a Patterned Wafer is ~560 Å.
The real thickness of thermal oxide in a STI structure is calculated based on the Silicon Consumption in the structure.

c) The silicon consumption is calculated by measurement of the difference in line width of the structure before and after anneal.

d) The thickness of the thermal oxide in the pattern is calculated using equation (2).

Measurements from the thickness of the line width before and after anneal shows 1 mm of Silicon Consumption on the side-wall, which corresponds to 250 Å of silicon consumed. From equation (2), the thermal oxide growth corresponding to this consumption is 560 Å.

Thus, the feasibility of growing a thermal oxide liner, underneath a CVD $SiO_2$ layer for an STI application, and measurement of thermal oxide thickness both by estimation and measurements and calculations have been demonstrated. This work has been more focused on resolving the measurement issues, and giving a general guideline to predict and calculate the thickness of thermal oxide.

In an alternative embodiment, dry oxidation to grow the thermal oxide is performed. Experiments were conducted to study dry oxidation of silicon underneath a CVD $SiO_2$ film.

Specifically tests were done on patterned STI structures without the thermal oxide. A run matrix of anneal temperature, anneal time and oxygen concentration was chosen for this evaluation. The CVD $SiO_2$ deposition was done using the WJ1000 and the anneal was done using a horizontal tube furnace. The run matrix is shown in the table 4 below.

TABLE 4

| Anneal Temp., ° C. | Anneal Time, Min. | $O_2$ Conc., % |
|---|---|---|
| 1000 | 100 | 25% |
| 1100 | 300 | 50% |

Anneal Conditions were as follows: (a) Loading @ 600° C. with $N_2$ flow of 6 slm, (b) Ramp up in $N_2$ only (6slm) at 13° C./min., (c) Total flows during anneal: 9.75 slm (mixture of $N_2$ and $O_2$ as per $O_2$ concentrations in the table), (d) Ramp down in $N_2$ only (6slm) at about 5–6° C./min., (e) Unloading @ 600° C. with $N_2$ flow of 6 slm.

The thermal oxide thickness in the STI Patterned structure was measured from the SEM's using the amount of silicon consumed from the oxidation process technique, and using the basic equations of thermal oxidation, the growth of thermal oxide was calculated.

The amount of silicon consumed on the side-walls of the structure was measured from the SEM's of pre and post anneals. The oxide thickness was calculated using equation (6) as follows:

$$X_{Th.\ Ox.} = [X_{Si\ Cons.}/0.44] \quad (6)$$

Results: The following data illustrated in Table 5 below was obtained from the anneal runs for the test matrix. The thermal oxide thickness was measured using equation (1).

TABLE 5

| Condition | Temp. ° C. | Time Min. | O2 Conc. | Si Cons. (A) | Sidewall Tox. (A) | Top Tox. (A) | Trench Depth (A) |
|---|---|---|---|---|---|---|---|
| 1 | 1000 | 100 | 50% | 195 | 443 | 30 | 4156 |
| 2 | 1000 | 100 | 100% | 199 | 452 | 49 | 4175 |
| 3 | 1000 | 300 | 50% | 233 | 530 | 133 | 4100 |
| 4 | 1000 | 300 | 100% | 254 | 577 | 205 | 4187 |
| 5 | 1100 | 100 | 50% | 238 | 541 | 167 | 4067 |
| 6 | 1100 | 100 | 100% | 367 | 833 | 200 | 4033 |
| 7 | 1100 | 300 | 25% | 300 | 682 | 100 | 4000 |
| 8 | 1100 | 300 | 50% | 467 | 1061 | 233 | 4000 |

Original trench dimensions: 0.15 μm wide at bottom (0.22 μm wide at top), 0.43 μm tall.

In general, the "pad oxide lifting" was very small compared to steam anneals. The thermal oxide growth under the nitride seems to be lower at lower temperatures, while the side-wall growth is higher. There is a smaller liner growth at the bottom of the trench, when compared to the sidewalls.

Thermal oxide growth rates under various process conditions were next investigated. Film properties such as stress, wet etch rate, refractive index and shrinkage were evaluated and shown in FIGS. 21 to 27. Specifically, deposition was carried out at a temperature in the range of about 450 to 500° C. in a WJ 1000T APCVD system. To achieve a film thickness of about 7 to 8 kÅ, a two operation was used. By varying the flow of TEOS with constant ozone, films were deposited with ration of ozone to TEOS of 8, 9, 11 and 14. Films were deposited on bare silicon on 200 mm wafers.

The CVD deposited films were then annealed to grow the thermal oxide according to the method of the present invention. The films were annealed at 900, 1000, and 1150° C. under a nitrogen ambient for 30 minutes. Pattern and bare silicon wafers coated with 1.5 kÅ silicon nitride were also used for annealing at a temperature of 1000° C. under a 50% oxygen ambient for 100, 200 and 300 minutes after deposition.

Film thickness and refractive index (RI) measurements were taken using a Tencor UV 1250 machine. The stress after deposition and annealing was measured with a Tencor FLX-5400 machine. HF (10:1) was used to determine the wet etching rate (WER). Verification of the formed thermal oxide thickness was evaluated using SEM on cross-sections of structures covered by silicon nitride.

Figure 21:
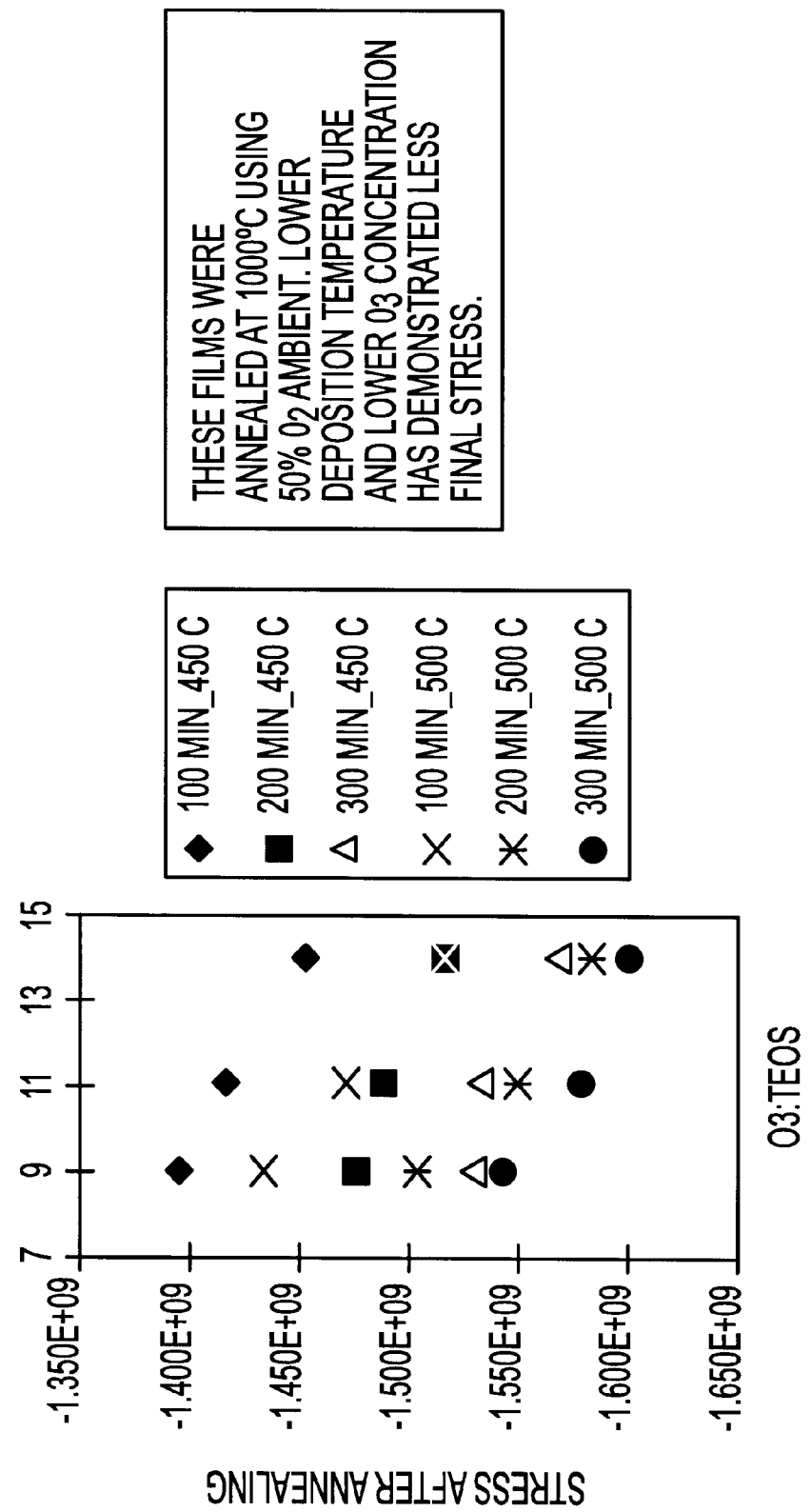
FIG. 21 is a graph showing stress verses ozone concentration, deposition temperature and anneal duration for films annealed at 1000° C. in a 50% oxygen ambient according to one embodiment of the present invention.

The inventors have found that the amount of stress appears to be primarily determined by the annealing temperature. The type of ambient does not appear to have much effect on the stress. The duration of the annealing cycle also does not appear to have a significant effect on the stress. However, the deposition temperature used to deposit the CVD film can effect the post-annealed stress in the film. As illustrated in FIG. 21, films deposited at 450° C. demonstrate less stress than films deposited at 500° C.

Figure 22:
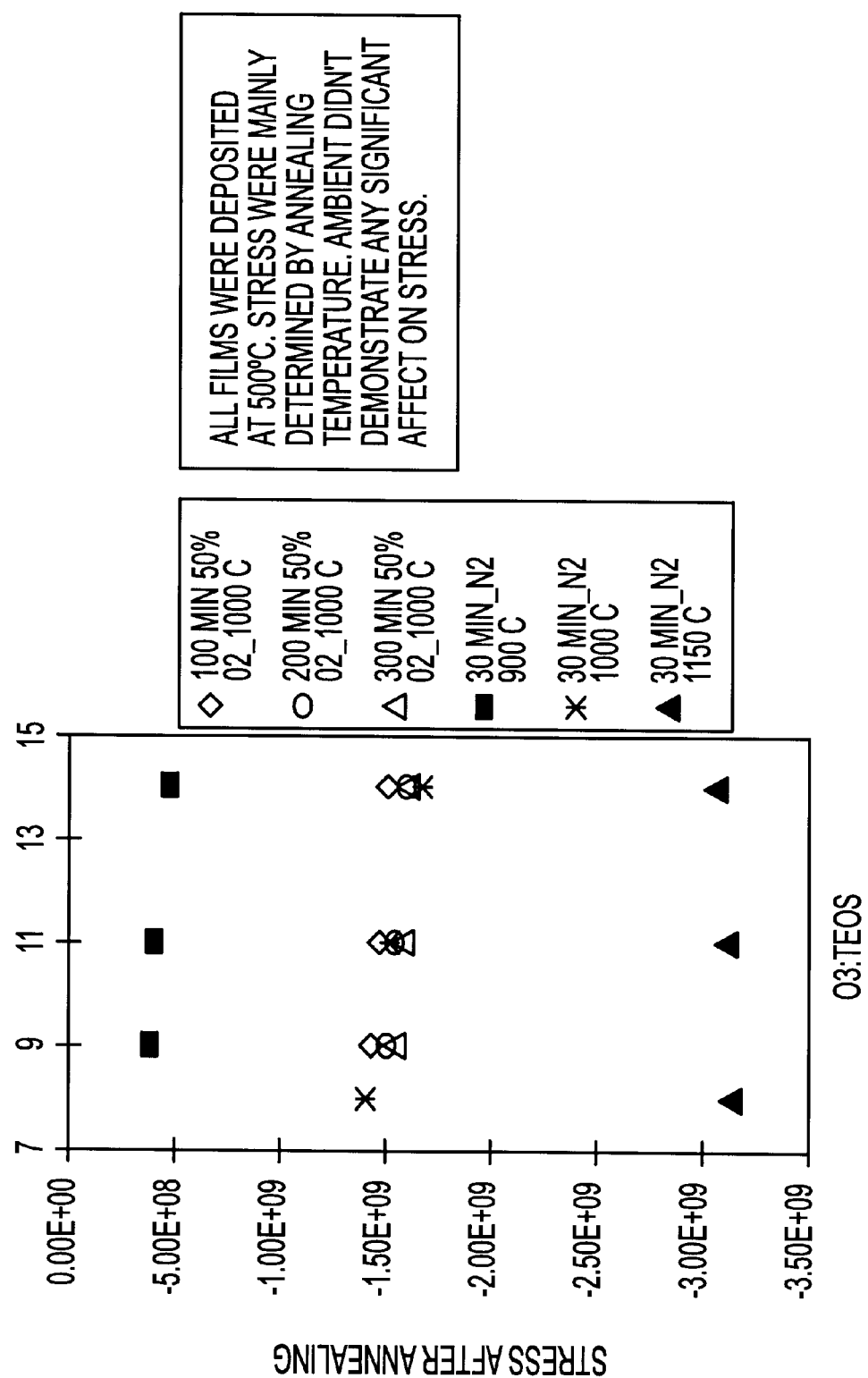
FIG. 22 is a graph illustrating a stress comparison verses ozone concentration, annealing ambient, duration and temperature for films deposited at 500° C. according to another embodiment of the present invention.

It has also been found that the ozone to TEOS ratios do not significantly effect the post-annealed stress in the film. Higher concentrations of ozone, however, generally result in more stress after the anneal step as shown in FIGS. 21 and 22. Once exception to this is when the anneal step is carried out at 1150° C. It appears that this high temperature anneal step results in a small reduction in the stress as the ozone concentration is increased.

Figure 23A:
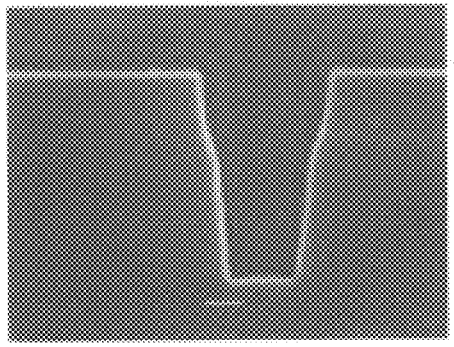
FIGS. 23a–d are SEM photographs showing the film at various steps in accordance with the present invention.
Figure 23B:
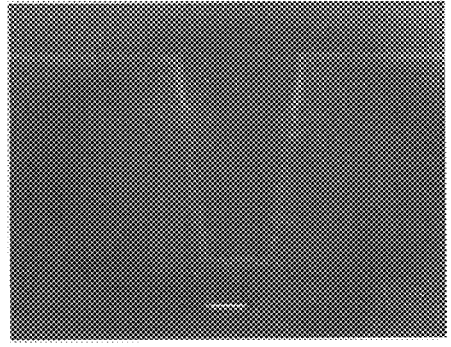
Figure 23C:
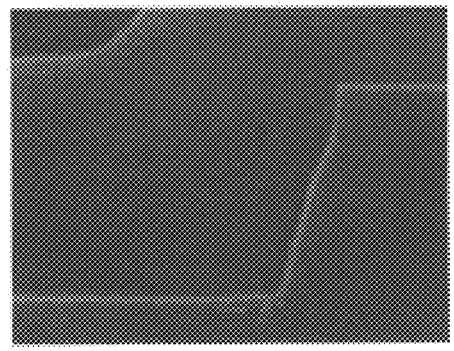
Figure 23D:
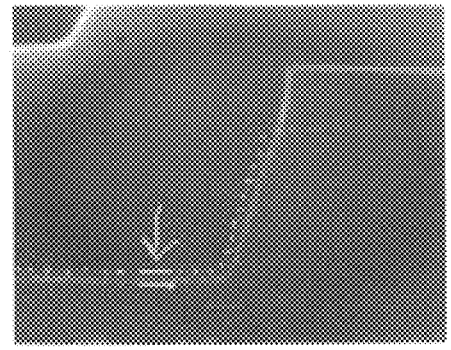

The thickness of the thermal oxide grown in the anneal step was evaluated by SEM. SEM photographs for films at various steps in the present method are depicted in FIGS. 23a–23d. Specifically, FIG. 23a shows the film deposited in a narrow trench using TEOS and ozone. FIG. 23b shows the same film after annealing with a 50% oxygen ambient at 1000° C. for 200 minutes. FIG. 23c shows another film deposited in a wide trench using TEOS and ozone. FIG. 23d shows the same film after annealing with a 50% oxygen ambient at 1000° C. for 200 minutes. Comparing FIGS. 23a and 23b reveals silicon consumption. The film in FIGS. 23c and 23d was treated with HF prior to taking the photograph. FIGS. 23c and 23d clearly show a boundary between the CVD oxide, the thermal oxide and the silicon substrate. The thickness of the thermal oxide is about 380 Å.

Figure 24:
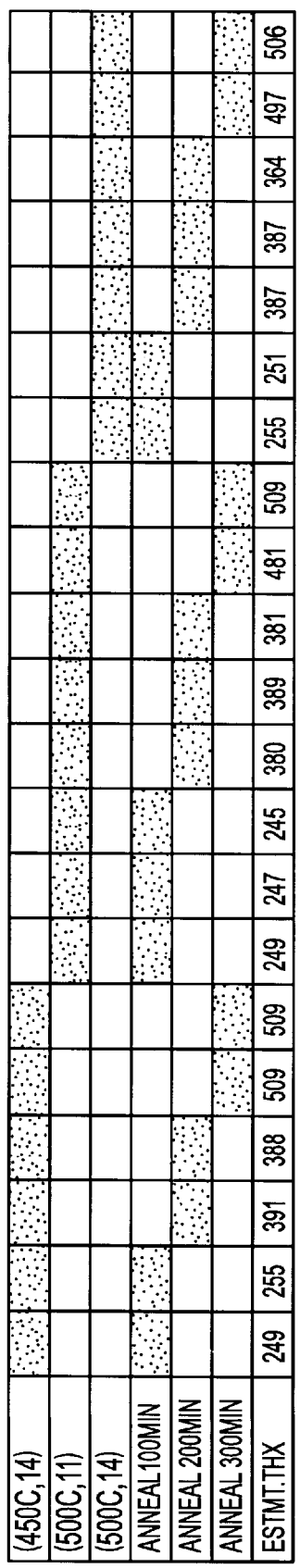
FIG. 24 is a table showing the estimated thickness of the thermal oxide grown at different process conditions according to the present invention.

Without direct contact with the silicon substrate, shrinkage of the CVD film can be accurately predicted by the thickness variation above the silicon nitride (SiNx). With the shrinkage rate, the thickness of the thermally grown oxide layer can be estimated by the following equation (7):

$$\text{thickness}_{thermal\ oxide} = O2 - O1 \times (N2/N1) \quad (7)$$

where N1 is the thickness above SiNx before anneal; N2 is the thickness above SiNx after anneal; O1 is the thickness above the silicon substrate (i.e. the trench) before anneal; and O2 is the thickness above the silicon substrate after the anneal. Given this equation, calculated thicknesses of the thermal oxide layer at various process conditions are shown in FIG. 24. FIG. 24 shows different deposition temperatures, ozone to TEOS ratios and anneal times. Each anneal step was carried out at 1000° C. in a 50% oxygen ambient environment. As shown, the average growth rate of the thermal oxide layer for the first 100 minutes of annealing is about 2.5 Å/min. The average growth rate slows to about 1.3 Å/min between 100 and 200 minuted of annealing, and to about 1.15 Å/min between 200 and 300 minutes of annealing. It appears that the ozone to TEOS ratio and the deposition temperature do not significantly effect the results.

Figure 25B:
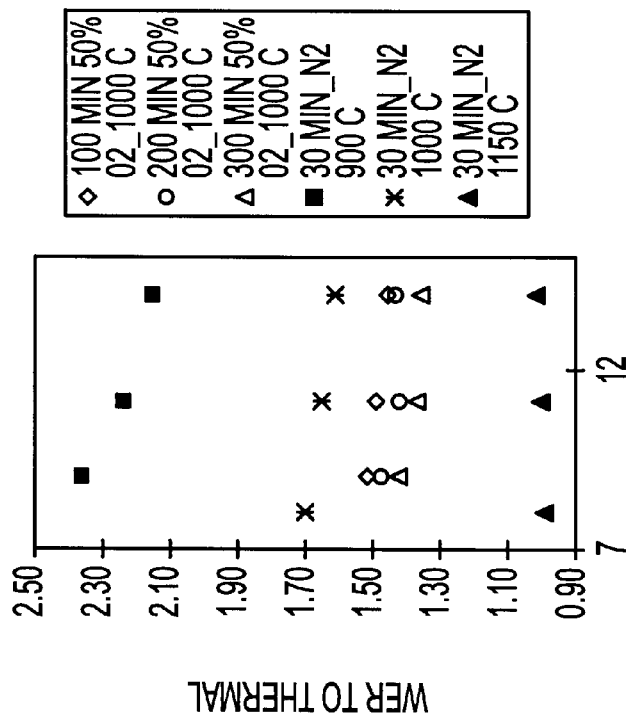
FIGS. 25a and 25b illustrate graphs showing the wet etch rate (WER) of films formed according to the present invention as a function of the ozone to TEOS ratio for various deposition temperatures and anneal times.
Figure 25A:
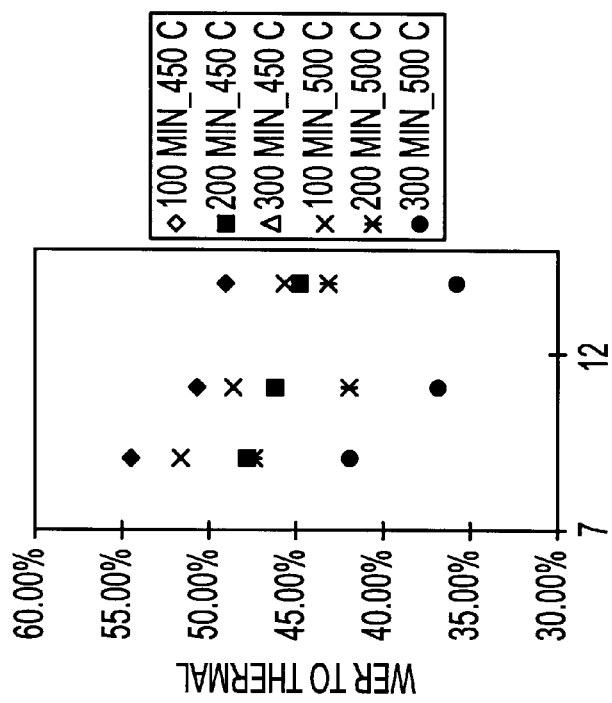

The WER results are shown in FIG. 25, which shows the WER to thermal oxide as a function of the ozone to TEOS ratio at various deposition temperatures and anneal times. It was found that the WER is reduced by about 15% when using an oxygen annealing ambient environment as compared with a nitrogen ambient. Also, increasing the deposition ozone concentration lowers the WER. Longer duration anneals also made the films more dense. The WER decreases with increasing anneal temperature for either anneal ambient.

Figure 27:
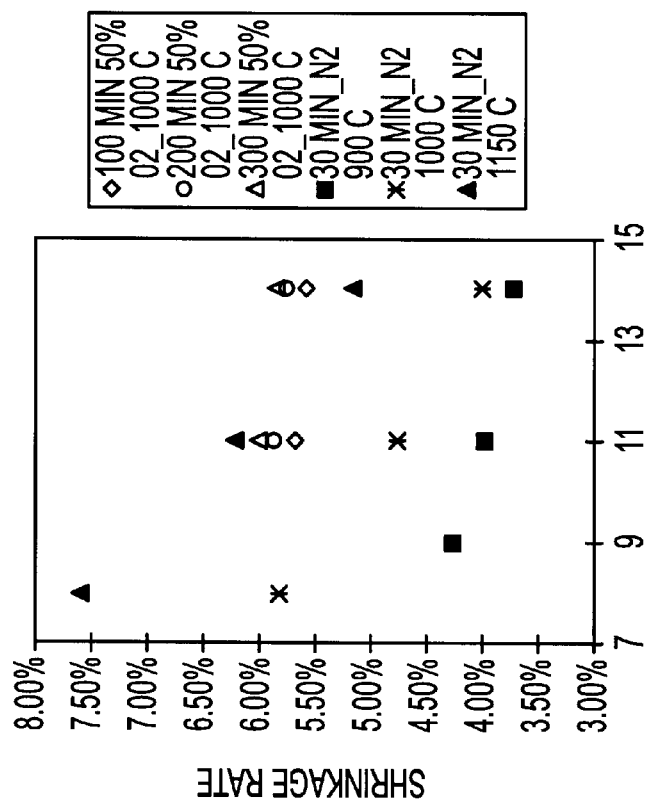
FIG. 27 shows the shrinkage rate for films formed according to the present invention as a function of the ozone to TEOS ratio for various anneal step temperatures, times, and ambient environments.
Figure 26:
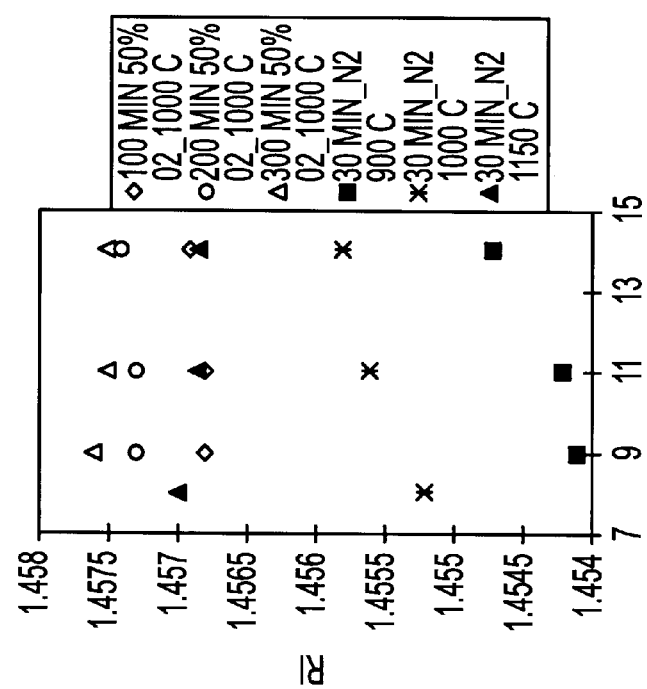
FIG. 26 shows the refractive index (RI) for films formed according to the present invention as a function of the ozone to TEOS ratio for various anneal step temperatures and times.

The refractive index (RI) and shrinkage results are shown in FIGS. 26 and 27, respectively, both as a function of the ozone to TEOS ratio for various annealing conditions. As shown, the oxygen ambient annealing condition results in higher RI as compared to nitrogen. Shrinkage rates were highly influenced by both the ratio of ozone to TEOS as well as the annealing temperatures. All the films tested as plotted in FIGS. 26 and 27 were deposited at 500° C.

As shown by the foregoing description and experiments, an improved trench isolation method has been provided by the present invention. Advantages include, but are not limited to, significantly simplifying silicon trench isolation (STI) module which reduces the cost of ownership of the STI module, by as much as 50%. The total process time is also reduced, up to as much as 40%. Oxide and nitride thicknesses are reduced and the CP non-uniformity is decreased. The in-trench stresses are decreased, and thus poly-wrapping issues are eliminated. The "bottom-up" fill deposition technique is shown to provide superior gap-fill without the presence of seams in the film. And further, the need for very expensive and time consuming anti-dishing CMP techniques may be eliminated due to the substantially planar film provided by the present invention.

Other features and advantages of the present invention may be apparent to a person of skill in the art who studies the present invention disclosure. The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

We claim:

1. A trench isolation method characterized in that a trench fill oxide layer is deposited on a substrate having trenches with sidewalls by chemical vapor deposition (CVD) using a silicon containing gas and ozone, said trench fill oxide layer is deposited prior to growth of a thermal oxide on the sidewalls of the trench, and where said trench fill oxide layer is deposited to form either a selective or non-selective oxide layer on the substrate.

2. The method of claim 1 wherein said method is carried out at a pressure in the range of about 200 Torr to 1200 Torr.

3. The method of claim 1 wherein said trench fill oxide layer includes etched silicon trenches with a top layer of hydrophilic material such as $Si_3N_4$ or thermal oxide.

4. The method of claim 1 wherein the substrate includes a semiconductor structure entirely over-coated with $Si_3N_4$.

5. The method of claim 1 wherein the substrate includes a semiconductor structure entirely over-coated with polysilicon epitaxial layer.

6. The method of claim 1 wherein said trench fill oxide is substantially planar.

7. A method of forming a film on the surface of a semiconductor substrate having one or more trench isolation structures with sidewalls formed thereon, comprising the steps of:

depositing an oxide film by chemical vapor deposition (CVD) using ozone and a silicon containing reactant atop the trench structures and sidewalls, and after said depositing step;

growing a thermal oxide layer on the surface of the sidewalls; and where said depositing step is carried out to deposit either a selective or non-selective oxide film on the surface of the substrate.

8. The method of claim 7 further comprising the step of: removing any native or chemical oxide from the sidewalls prior to said growing step.

9. The method of claim 7 wherein said growing step is carried out by annealing at a temperature in the range of about 700 to 1200° C., for a period of time in the range of about 30 seconds to 300 minutes.

10. The method of claim 9 wherein the annealing occurs in either an oxygen or steam environment.

11. The method of claim 7 wherein said depositing step is carried out at a temperature in the range of about 300 to 600° C., and at a pressure in the range of about 200 Torr to 1200 Torr.

12. The method of claim 7 wherein the film formed on the surface of the substrate is substantially planar.

13. The method of claim 7 wherein said depositing step is carried out with ozone and TEOS having an ozone to TEOS ratio in the range of approximately 5 to 200.

14. The method of claim 7 wherein said depositing step is carried out at a temperature in the range of approximately 350 to 450° C., to deposit the selective oxide film on the surface of the substrate.

15. The method of claim 7 wherein said growing step is carried out in a single wafer furnace.

16. The method of claim 7 wherein said growing step is carried out in a RTP system.

17. A method of forming a film on the surface of a semiconductor substrate having one or more trench isolation structures with sidewalls formed thereon, comprising the steps of:

depositing an oxide film by chemical vapor deposition (CVD) using ozone and a silicon containing reactant atop the trench structures and sidewalls where said depositing step is carried out to deposit either a selective or non-selective oxide film on the surface of the substrate, and after said depositing step;

growing a thermal oxide layer on the surface of the sidewalls; and densifying said oxide film deposited in the trench structure, wherein said growth of said thermal oxide layer on the surface of the sidewall and said densification of said oxide film deposited in the trench structure are performed simultaneously.

* * * * *